(12) United States Patent
Brink et al.

(10) Patent No.: US 10,976,671 B2
(45) Date of Patent: *Apr. 13, 2021

(54) SHADOW MASK AREA CORRECTION FOR TUNNEL JUNCTIONS

(71) Applicant: International Business Machines Corporation, Armonk, NY (US)

(72) Inventors: Markus Brink, White Plains, NY (US); Sami Rosenblatt, White Plains, NY (US); Bryan D. Trimm, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/581,804

(22) Filed: Sep. 25, 2019

(65) Prior Publication Data

US 2020/0019068 A1 Jan. 16, 2020

Related U.S. Application Data

(63) Continuation of application No. 15/805,306, filed on Nov. 7, 2017, now Pat. No. 10,503,077.

(51) Int. Cl.
*G03F 7/20* (2006.01)
*G03F 1/36* (2012.01)
(Continued)

(52) U.S. Cl.
CPC ............ *G03F 7/70633* (2013.01); *G03F 1/36* (2013.01); *G03F 7/70441* (2013.01); *H01L 39/2493* (2013.01); *H01L 43/12* (2013.01)

(58) Field of Classification Search
CPC .... G03F 1/36; G03F 7/70441; G03F 7/70633; H01L 43/12
(Continued)

(56) References Cited

U.S. PATENT DOCUMENTS

| | | |
|---|---|---|
| 4,470,190 A | 9/1984 | Fulton et al. |
| 6,087,772 A | 7/2000 | Ootsuki et al. |

(Continued)

OTHER PUBLICATIONS

Cord, B. et al., "Robust shadow-mask evaporation via lithographically controlled undercut", Journal of Vacuum Science & Technology B, vol. 24, No. 6, 2006, pp. 3139-3143.

(Continued)

*Primary Examiner* — Sun J Lin
(74) *Attorney, Agent, or Firm* — Cantor Colburn LLP; Douglas Pearson

(57) ABSTRACT

A technique relates to correcting an area of overlap between two films created by sequential shadow mask evaporations. At least one process is performed of: correcting design features in an original layout to generate a corrected layout using a software tool, such that the corrected layout modifies shapes of the design features and correcting the design features in the original layout to generate the corrected layout using a lithographic tool, such that the corrected layout modifies the shapes of the design features. The modified shapes of the design features are patterned at locations on a wafer according to the corrected layout using the lithographic tool. A first film is deposited by an initial shadow mask evaporation and a second film by a subsequent shadow mask evaporation to produce corrected junctions at the locations on the wafer, such that the first film and the second film have an overlap.

20 Claims, 30 Drawing Sheets

(51) Int. Cl.
*H01L 43/12* (2006.01)
*H01L 39/24* (2006.01)

(58) Field of Classification Search
USPC .................................. 716/50, 53, 54, 55
See application file for complete search history.

(56) References Cited

U.S. PATENT DOCUMENTS

| | | |
|---|---|---|
| 6,605,822 B1 | 8/2003 | Blais et al. |
| 6,670,081 B2 | 12/2003 | Laidig et al. |
| 6,822,248 B2 | 11/2004 | Ferrera et al. |
| 6,891,236 B1 | 5/2005 | Yamazaki |
| 7,015,505 B2 | 3/2006 | Yamazaki et al. |
| 7,700,444 B2 | 4/2010 | Chen |
| 8,629,423 B1 | 1/2014 | Kislov |
| 8,666,208 B1 | 3/2014 | Amirparviz |
| 8,765,583 B2 | 7/2014 | Riordon et al. |
| 8,882,917 B1 | 11/2014 | Cheng et al. |
| 9,325,007 B2 | 4/2016 | Kwak et al. |
| 10,503,077 B2 * | 12/2019 | Brink et al. .............. G03F 1/36 |
| 2008/0149479 A1 | 6/2008 | Olofsson et al. |
| 2011/0151190 A1 | 6/2011 | Chung et al. |
| 2015/0118604 A1 | 4/2015 | Dynes et al. |
| 2018/0308744 A1 | 10/2018 | Muir |
| 2018/0358537 A1 | 12/2018 | Brink et al. |
| 2018/0358538 A1 | 12/2018 | Brink et al. |
| 2019/0137891 A1 | 5/2019 | Brink et al. |

OTHER PUBLICATIONS

Costache, M. V. et al., "Lateral metallic devices made by a multiangle shadow evaporation technique", Journal of Vacuum Science & Technology B, vol. 30, No. 4, 2012, 04E105, 5 pages.

Dolan, G. J., "Offset masks for lift-off photoprocessing", Applied Physics Letters, vol. 31, No. 5, 1977, pp. 337-339.

International Search Report and Written Opinion for PCT/EP2017/084015 dated Sep. 28, 2018 (11 pages).

Kolbel, M. et al., "Shadow-Mask Evaporation through Monolayer-Modified Nanostencisl", 2002, American Chemical Society, Nano Letters, vol. 2, No. 12, pp. 1339-1343.

List of IBM Patents or Patent Applications Treated as Related; (Appendix P); Date Filed: Sep. 25, 2019, 2 pages.

Potts, A. et al., "CMOS compatible fabrication methods for submicron Josephson junction qubits", IEE Proceedings-Science, Measurement and Technology, vol. 148, No. 5, 2001, pp. 225-228.

Zhou, Y. et al., "Simple Fabrication of Molecular Circuits by Shadow Mask Evaporation", 2003, American Chemistry Society, Nano Letters, vol. 3, No. 10, pp. 1371-1374.

* cited by examiner

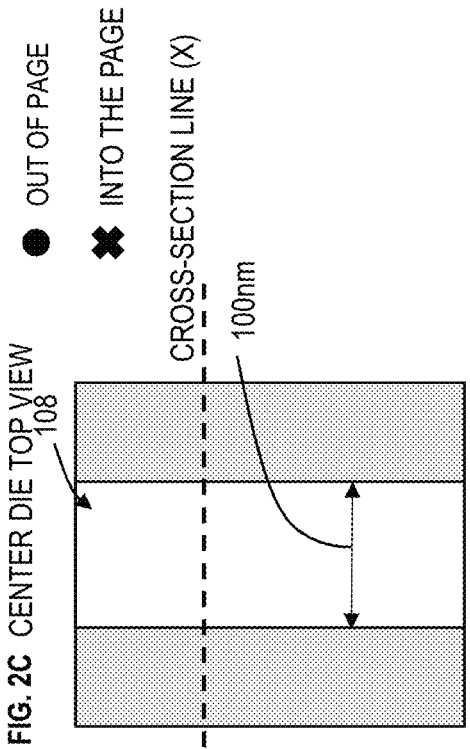
FIG. 2A LEFT DIE TOP VIEW
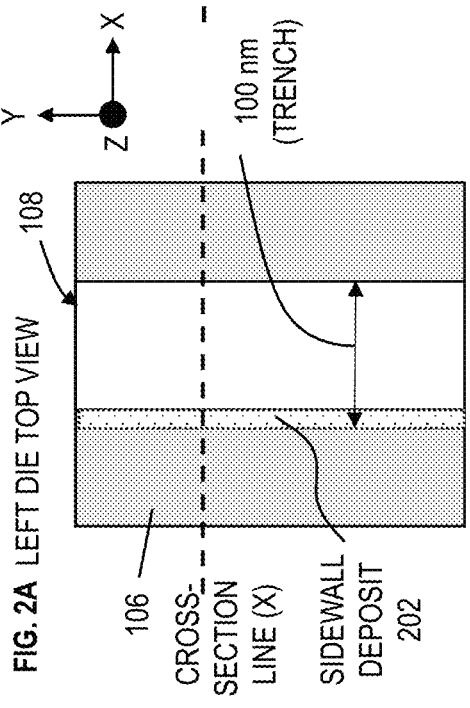
FIG. 2B LEFT DIE CROSS-SECTION
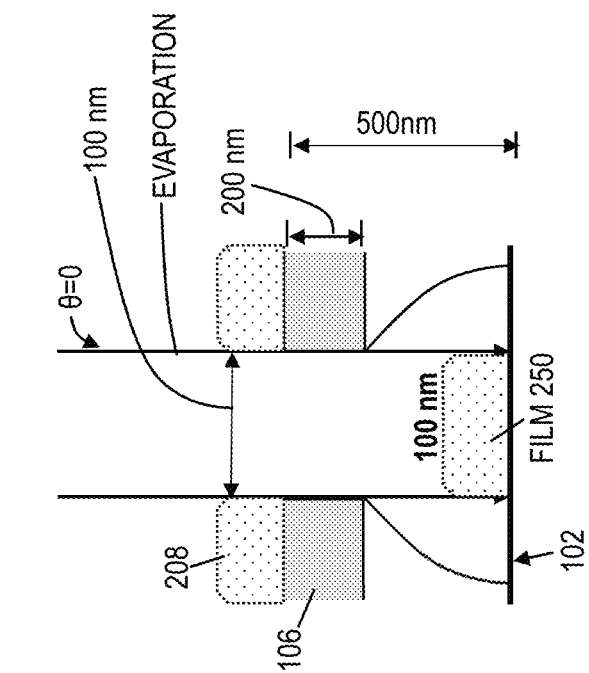
FIG. 2C CENTER DIE TOP VIEW
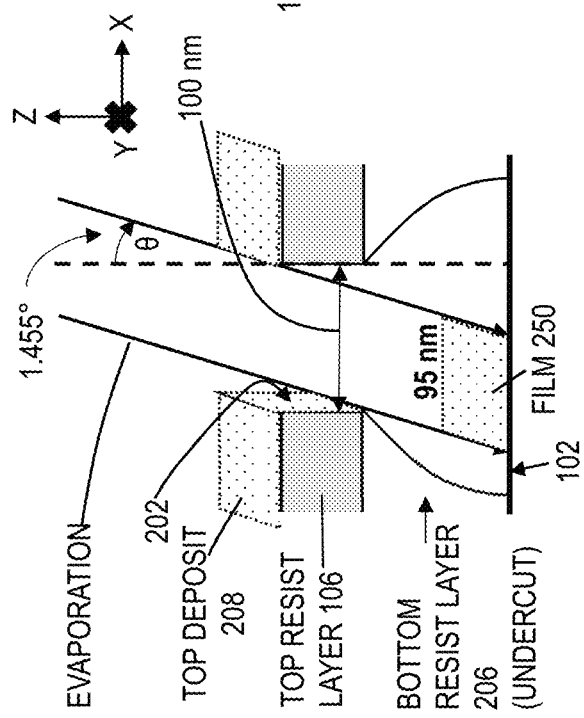
FIG. 2D CENTER DIE CROSS-SECTION

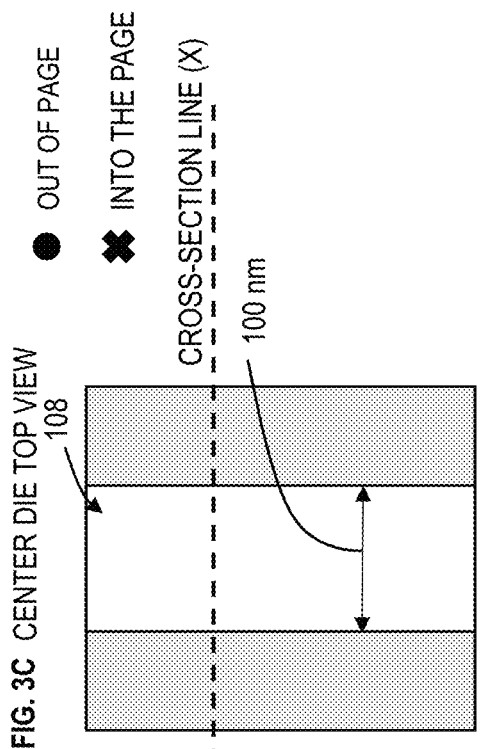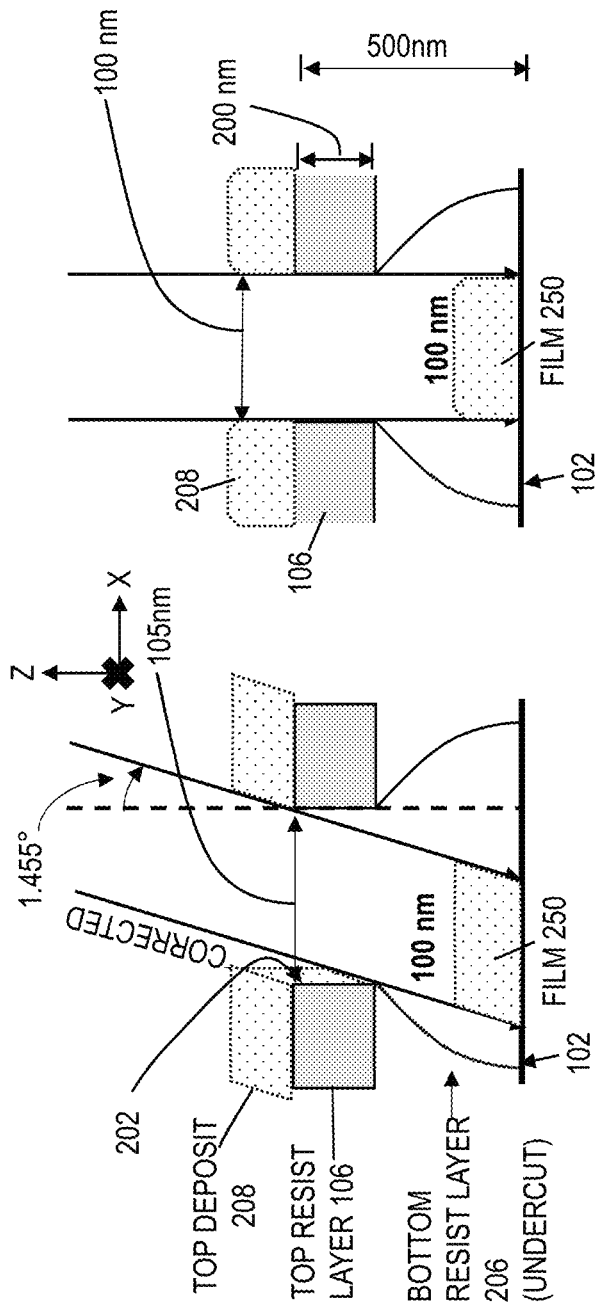

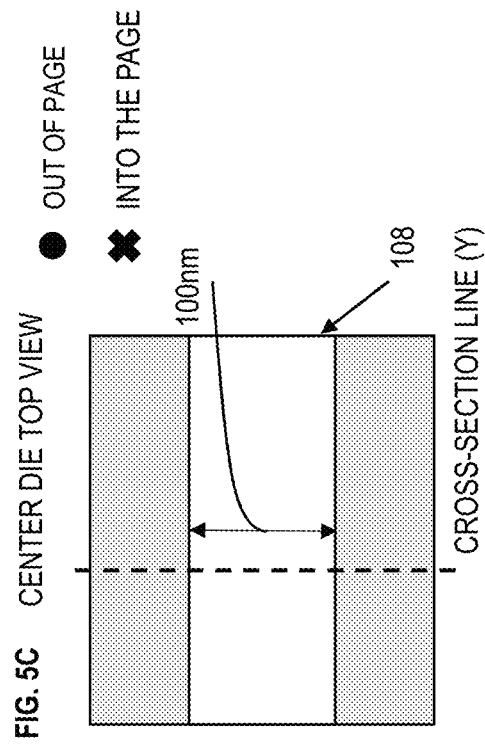
FIG. 5A  TOP DIE TOP VIEW
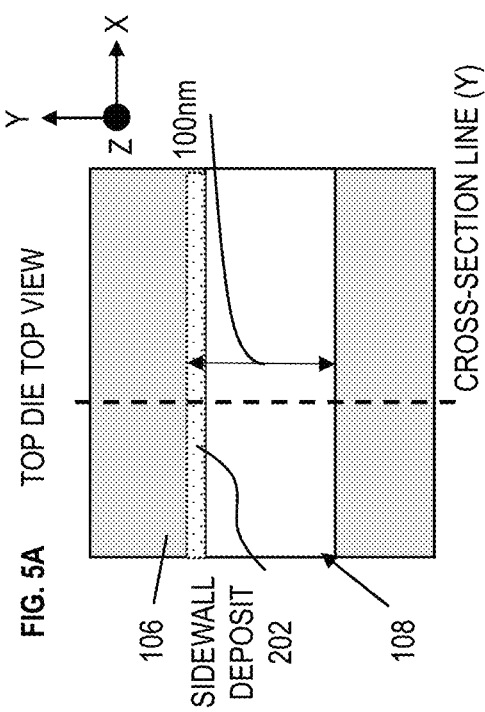
FIG. 5C  CENTER DIE TOP VIEW
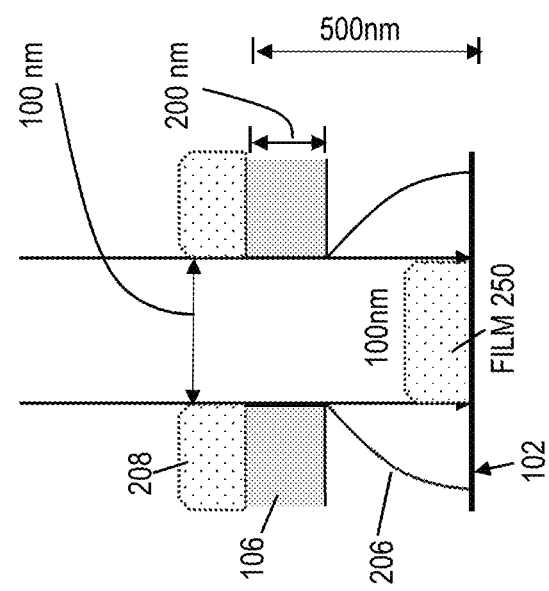
FIG. 5B  TOP DIE CROSS-SECTION
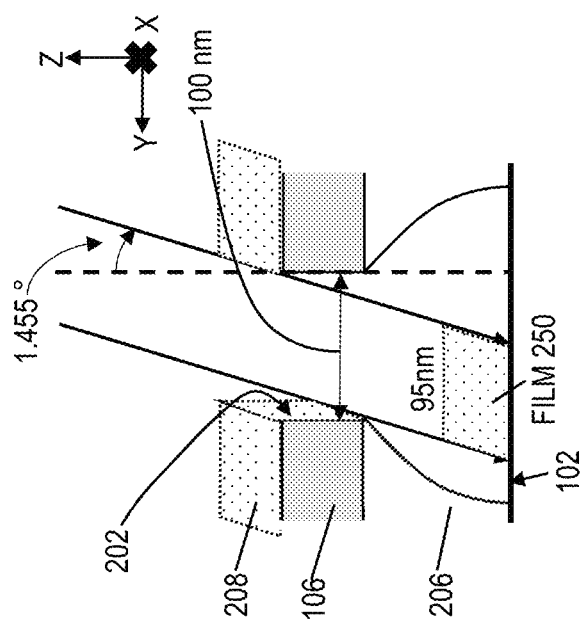
FIG. 5D  CENTER DIE CROSS-SECTION

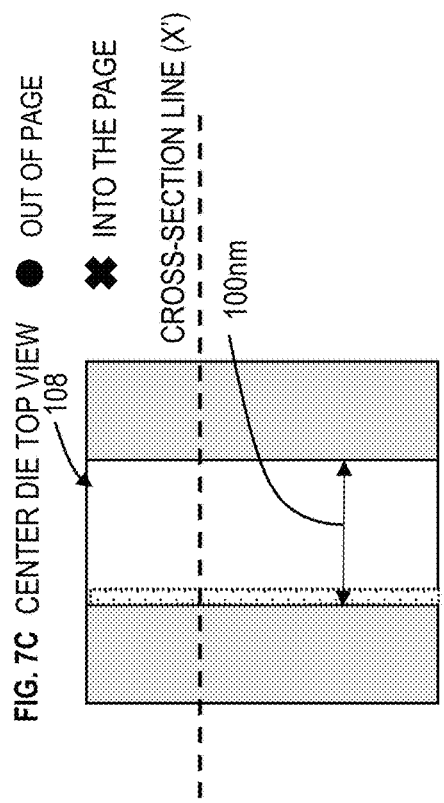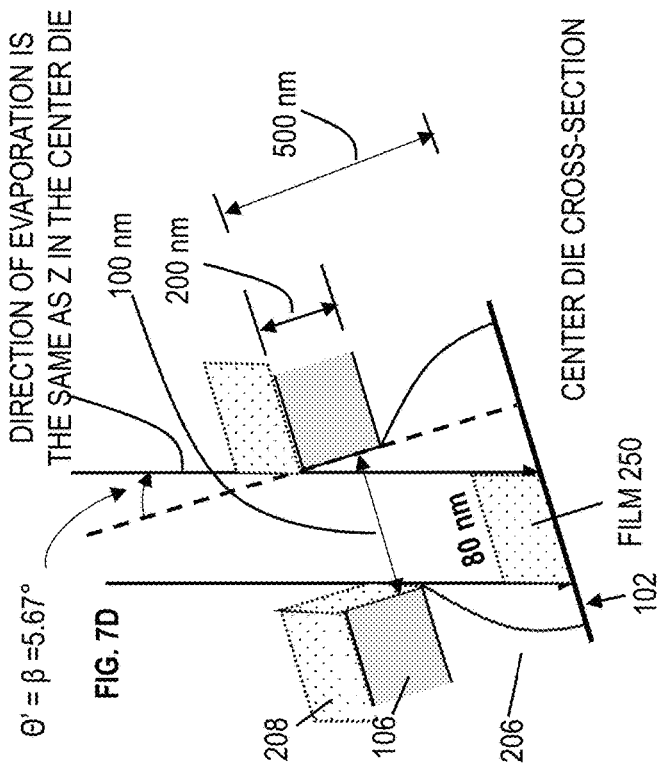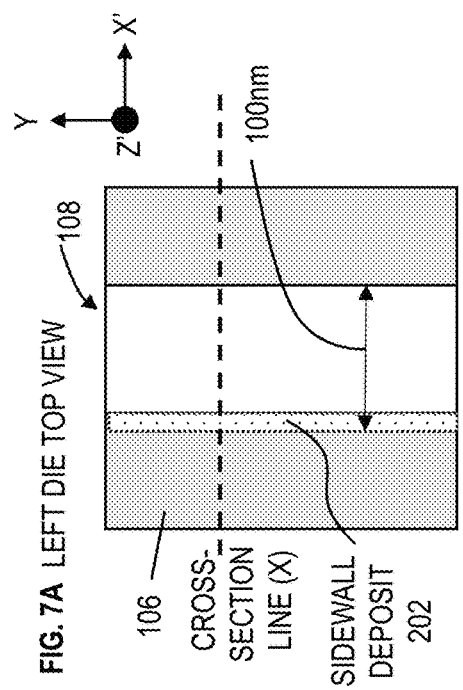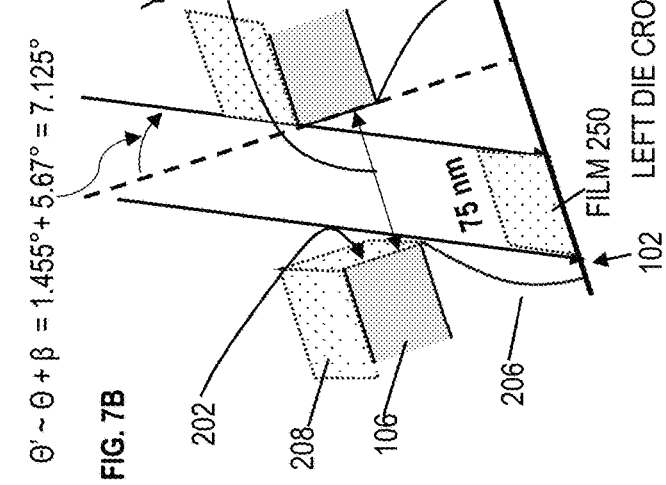

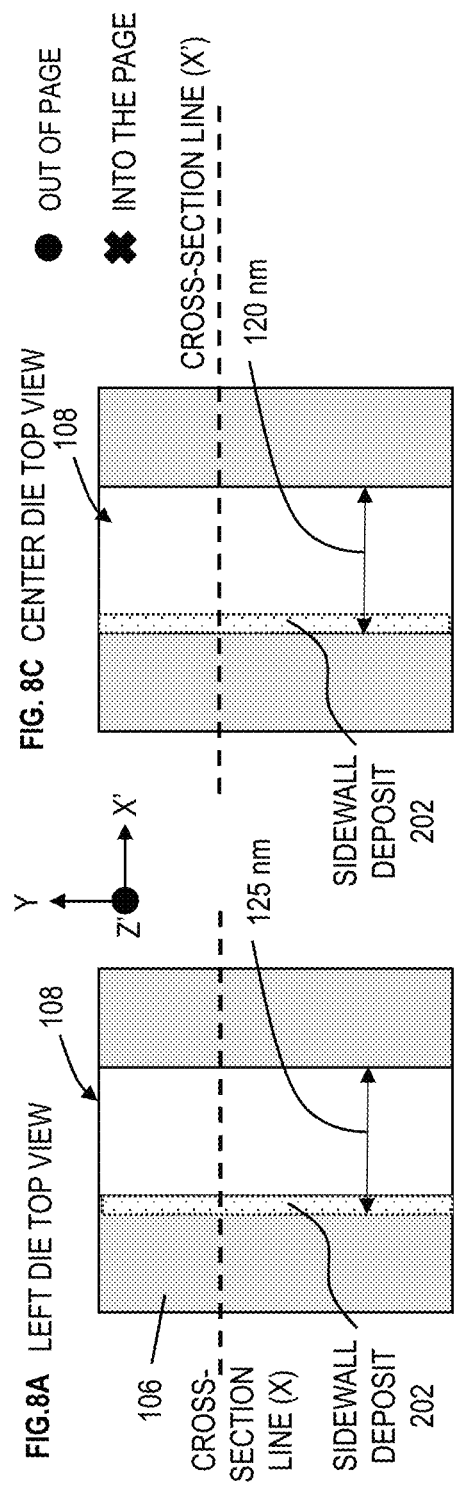
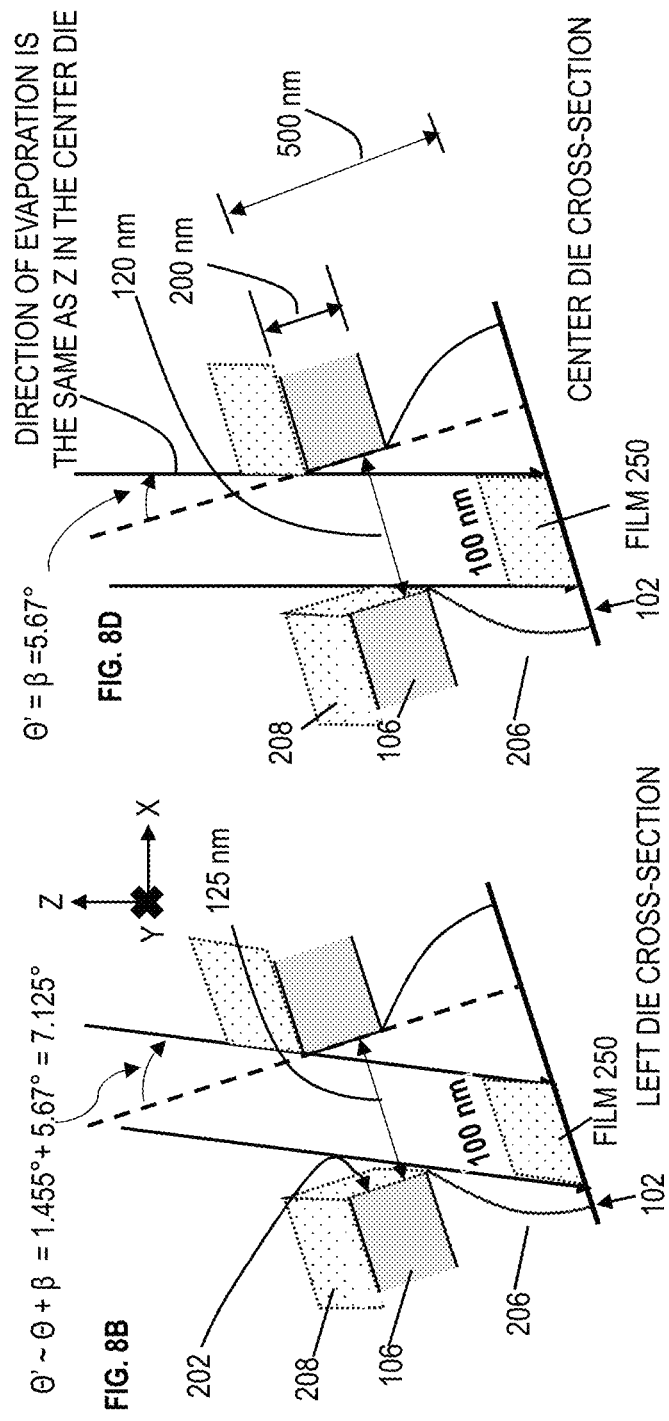

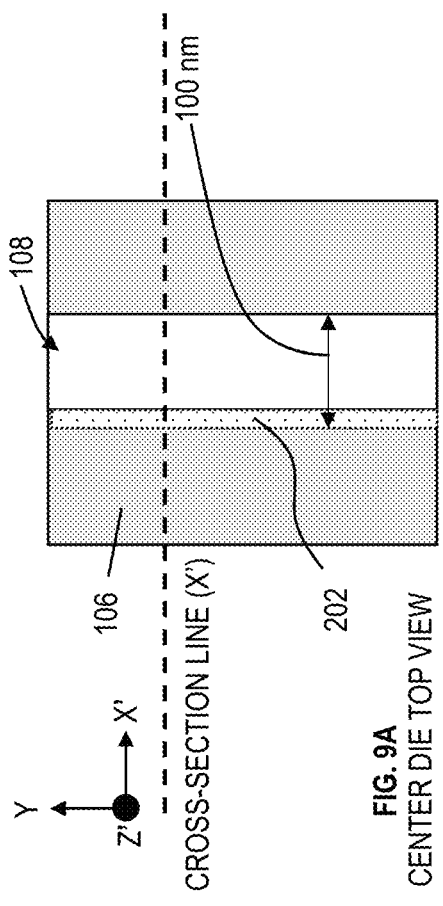
FIG. 9A
CENTER DIE TOP VIEW
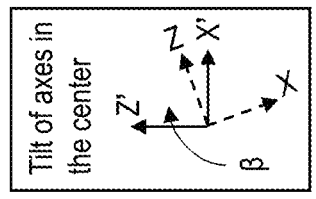
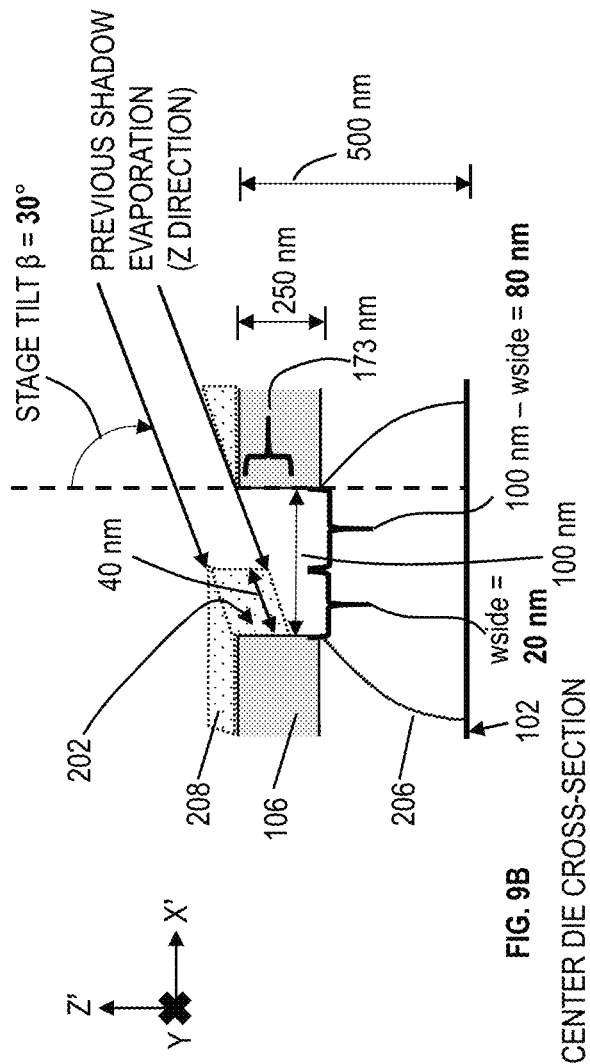
FIG. 9B
CENTER DIE CROSS-SECTION

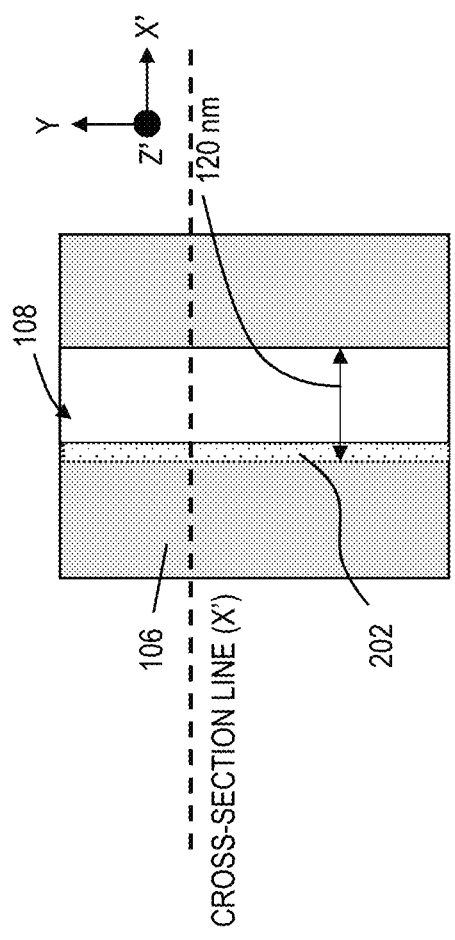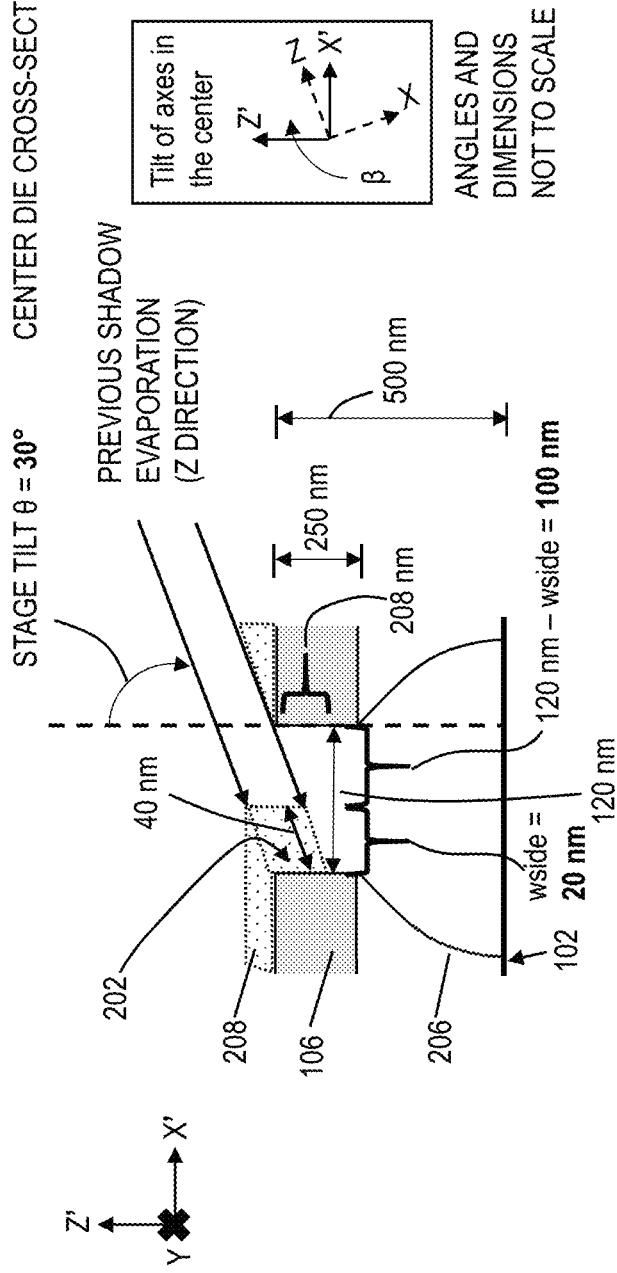

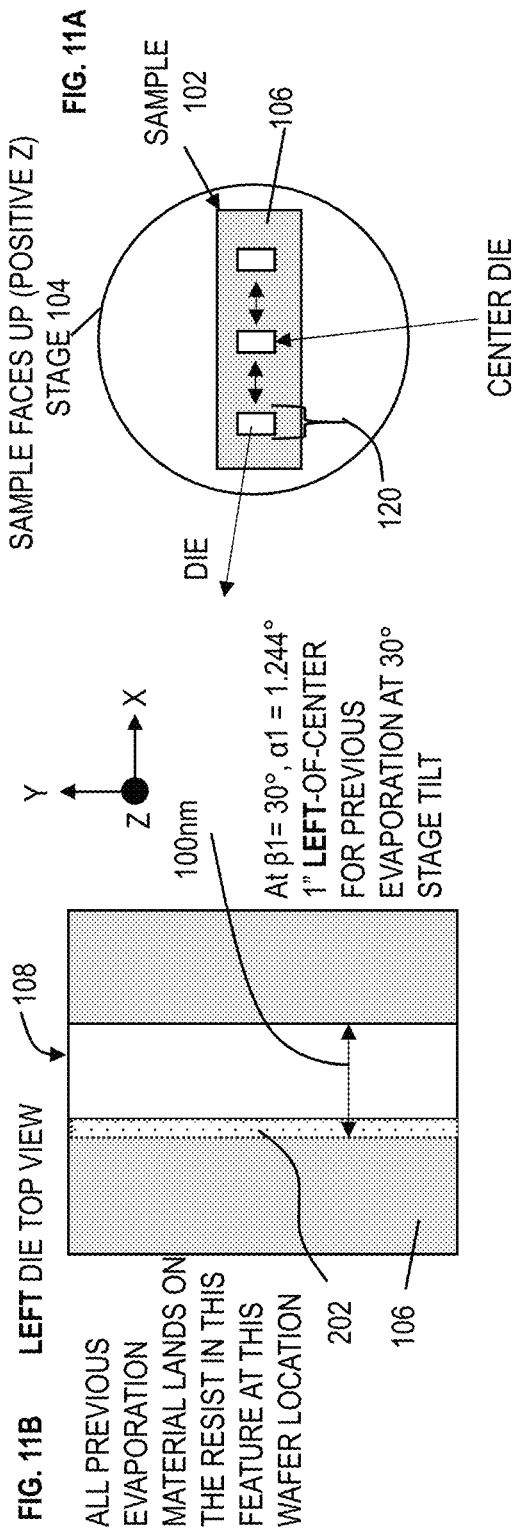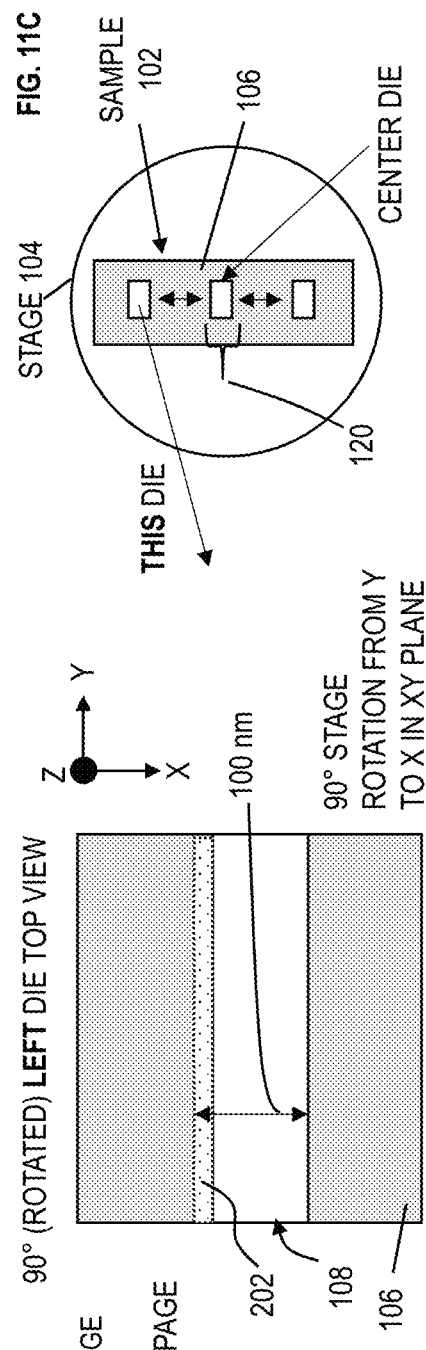

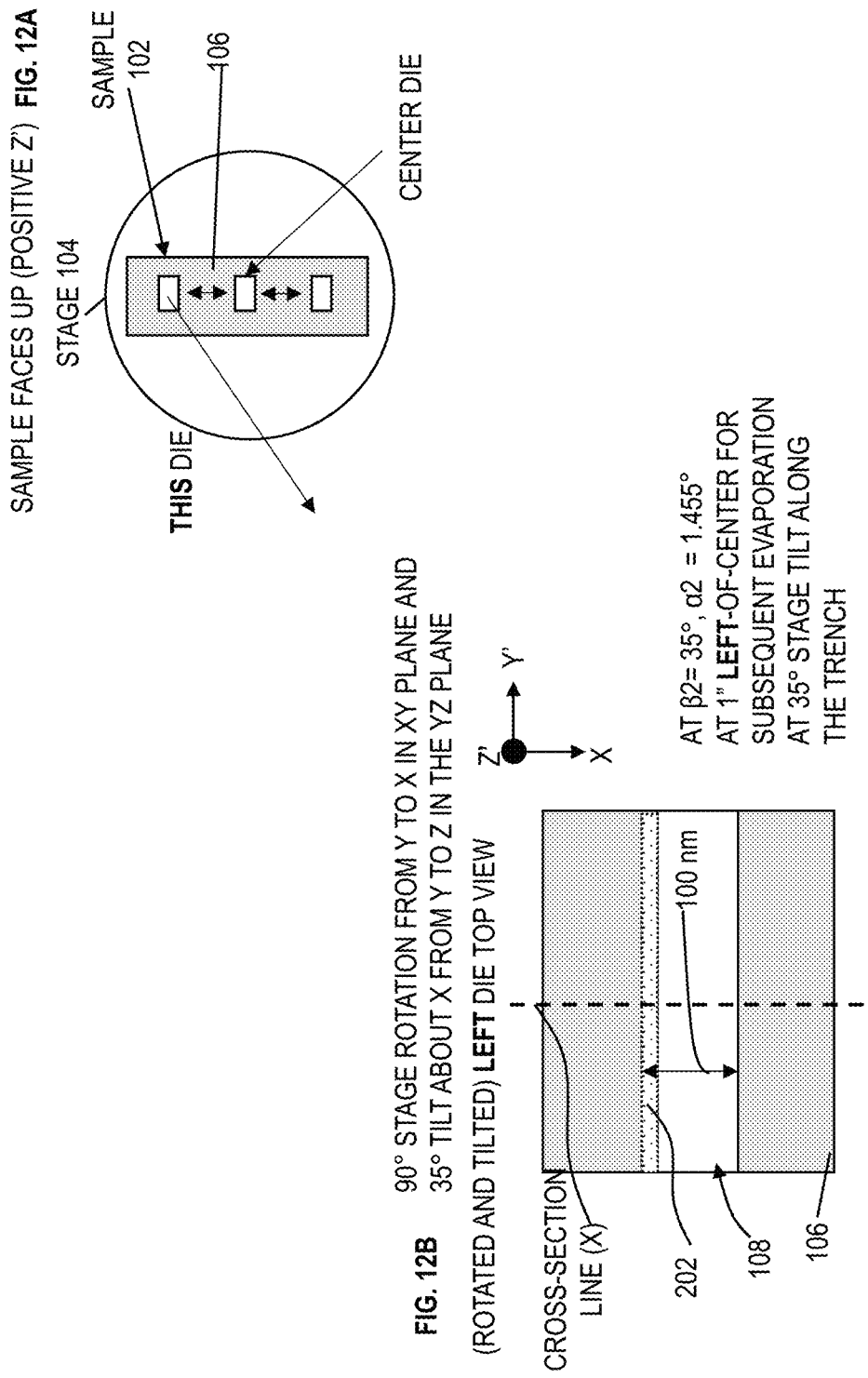

(ROTATED AND TILTED) LEFT DIE CROSS-SECTION

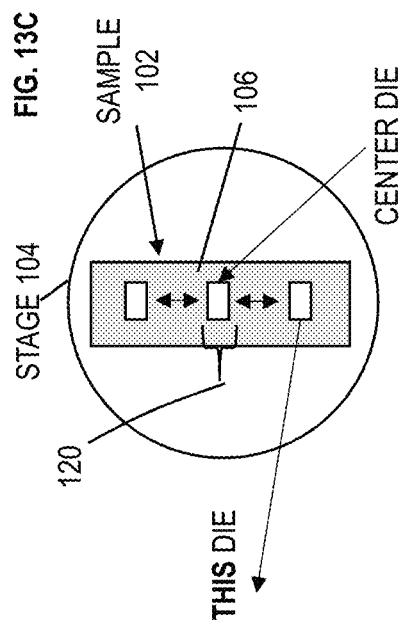
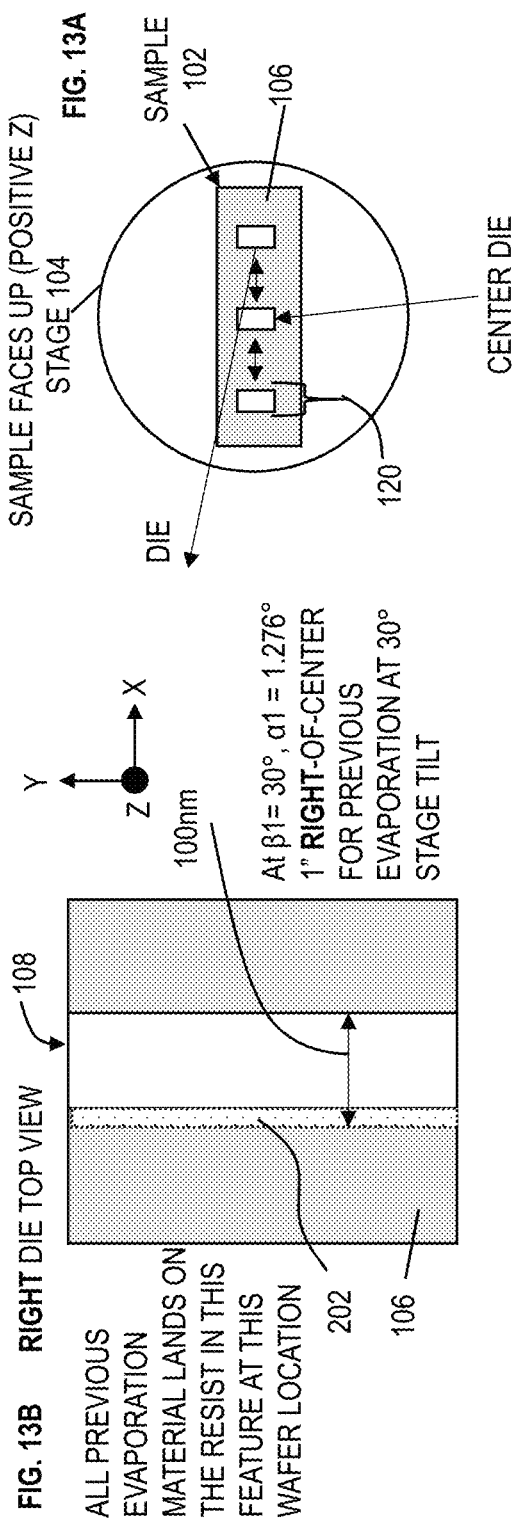
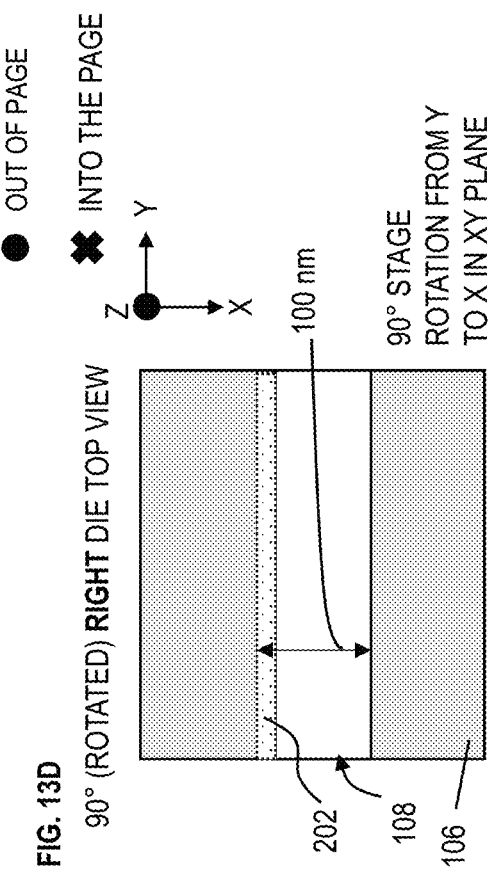

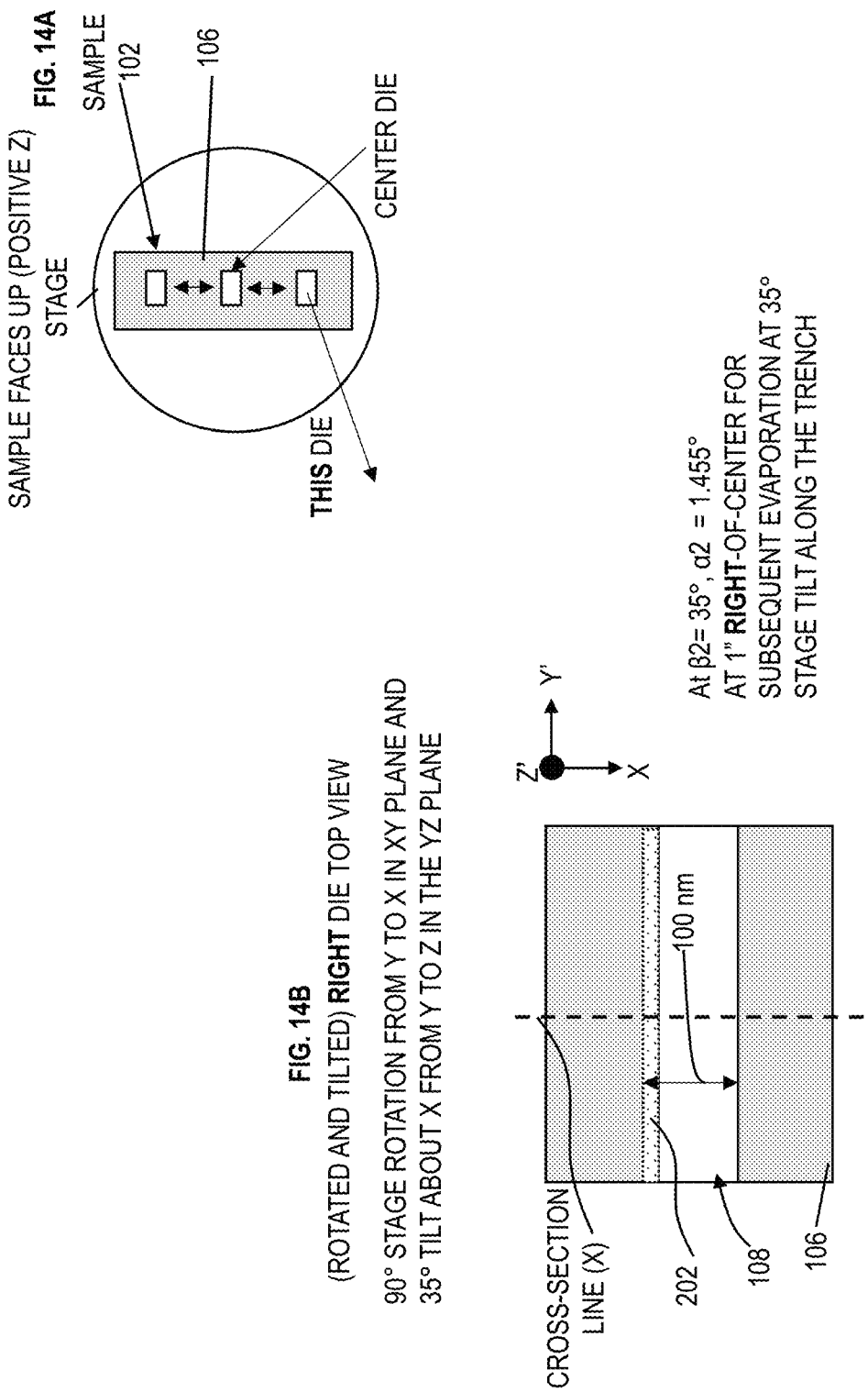

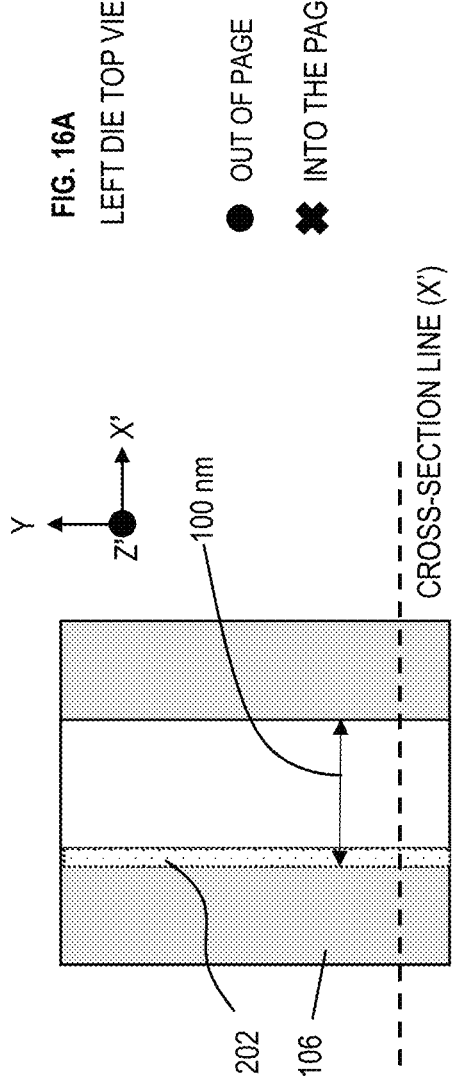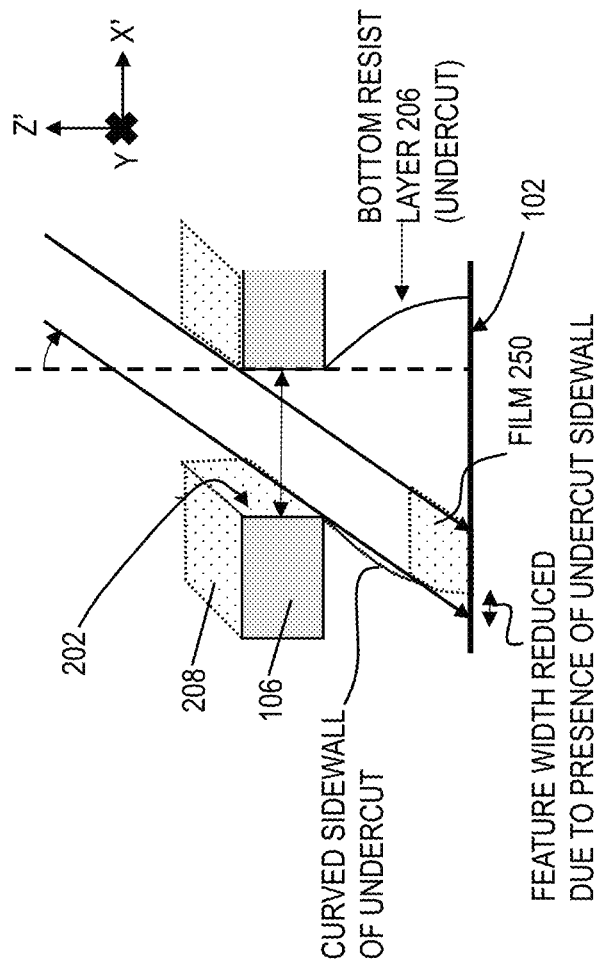

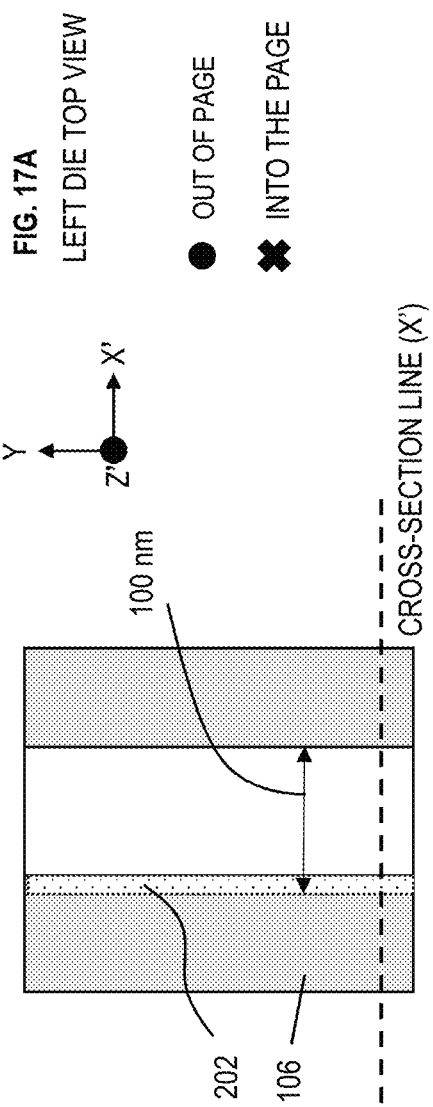
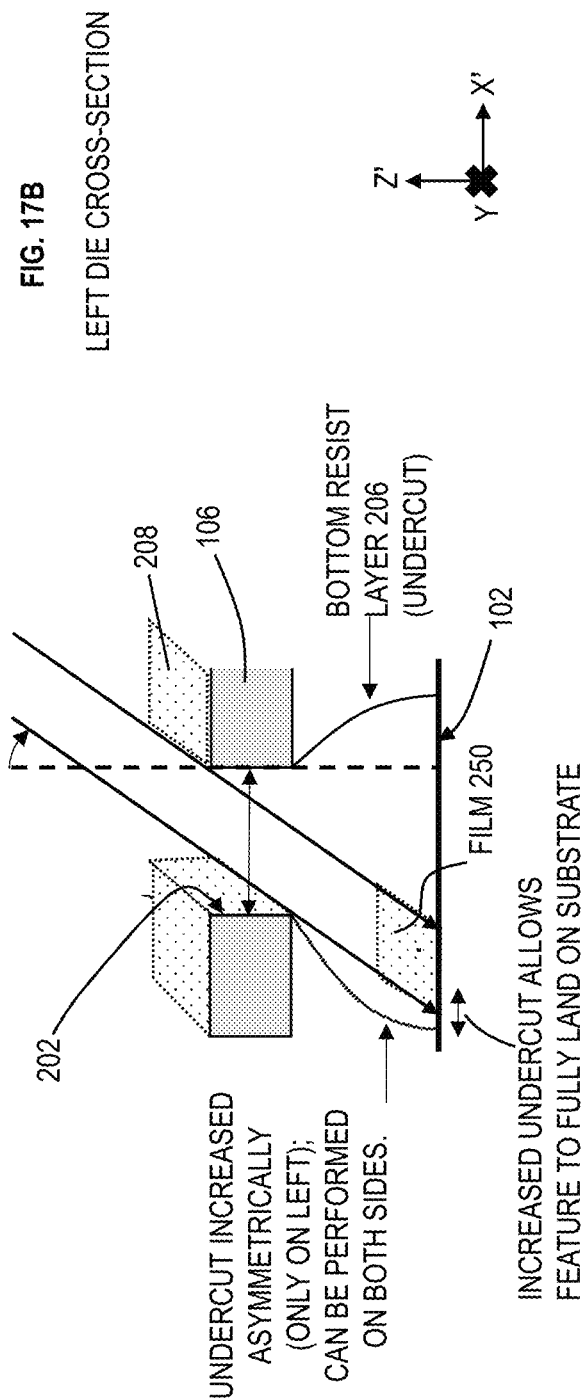

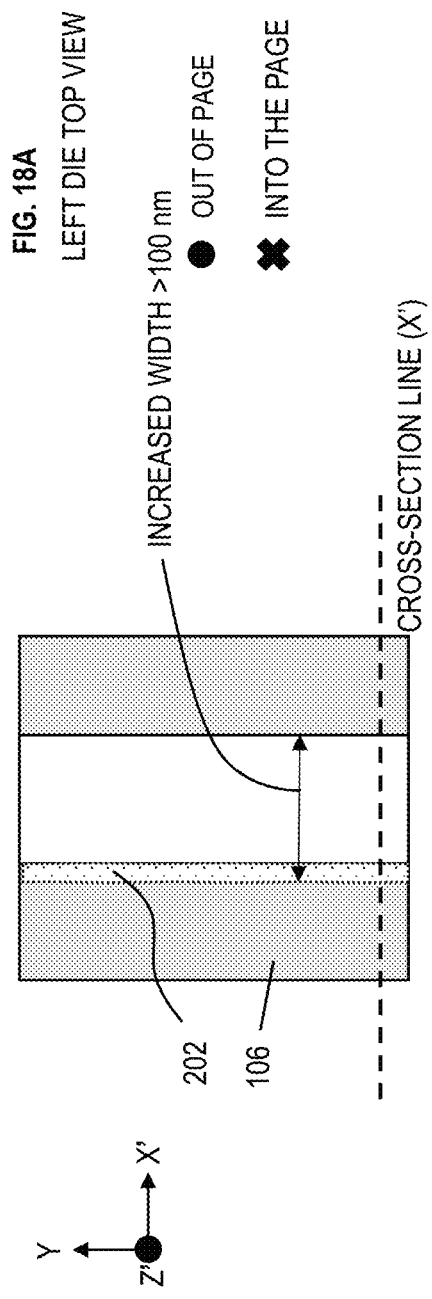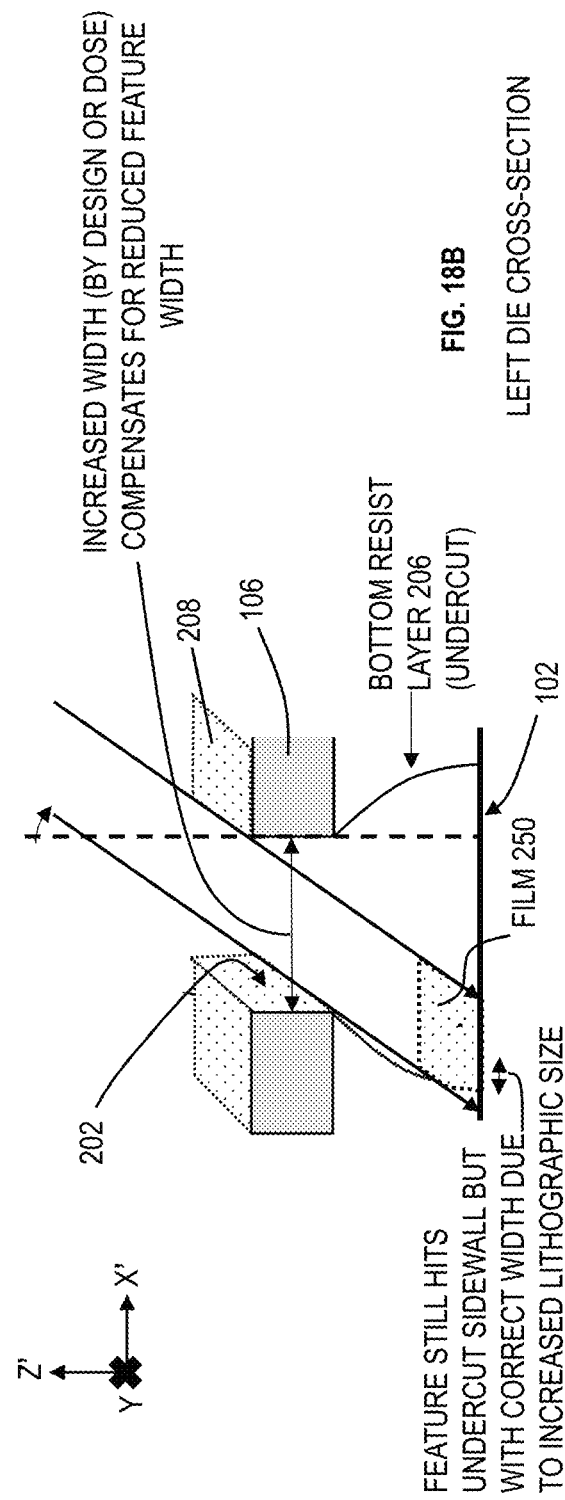

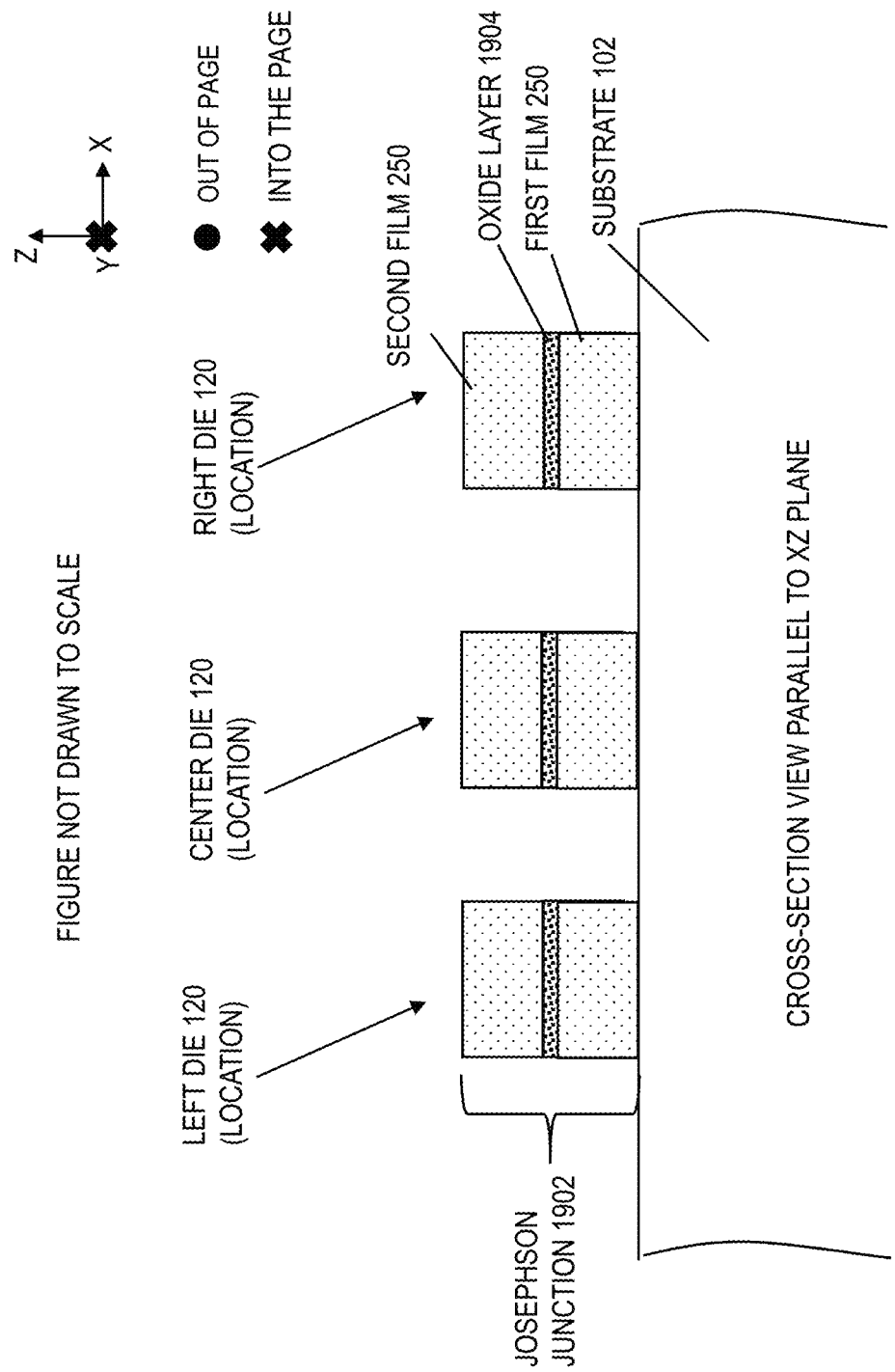

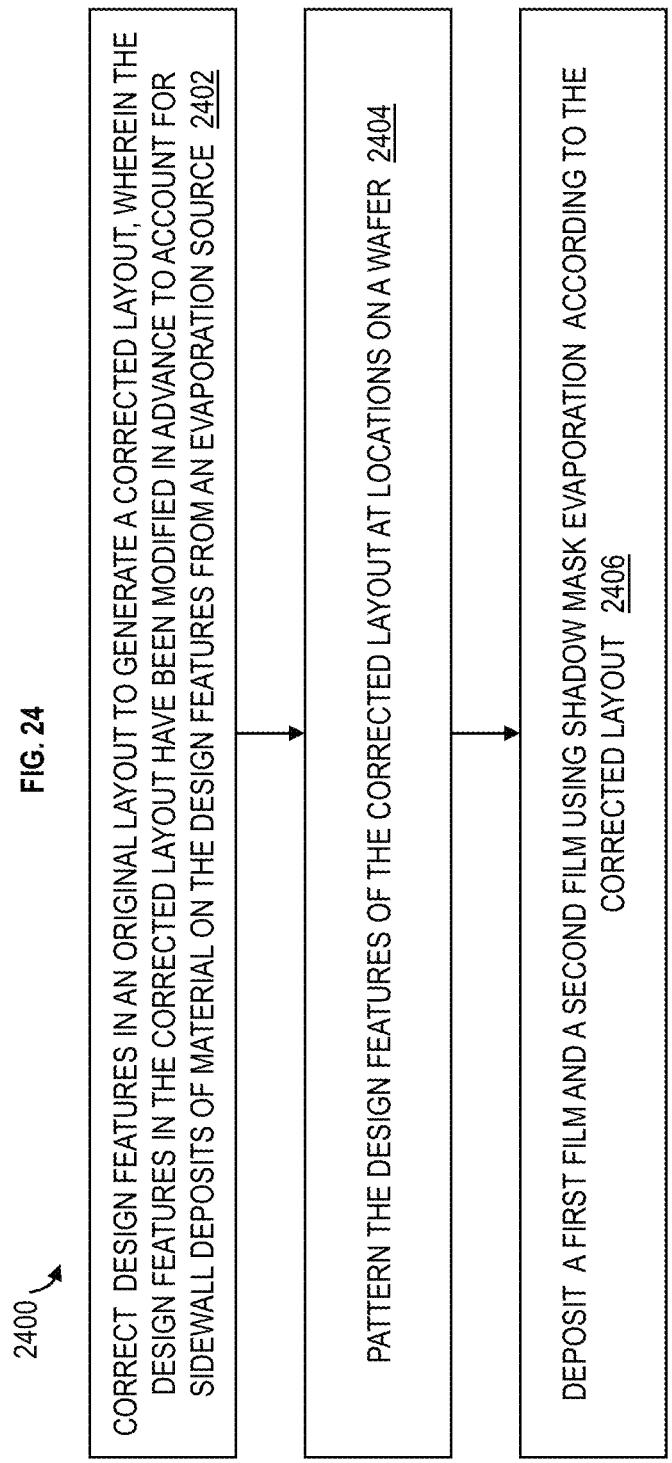

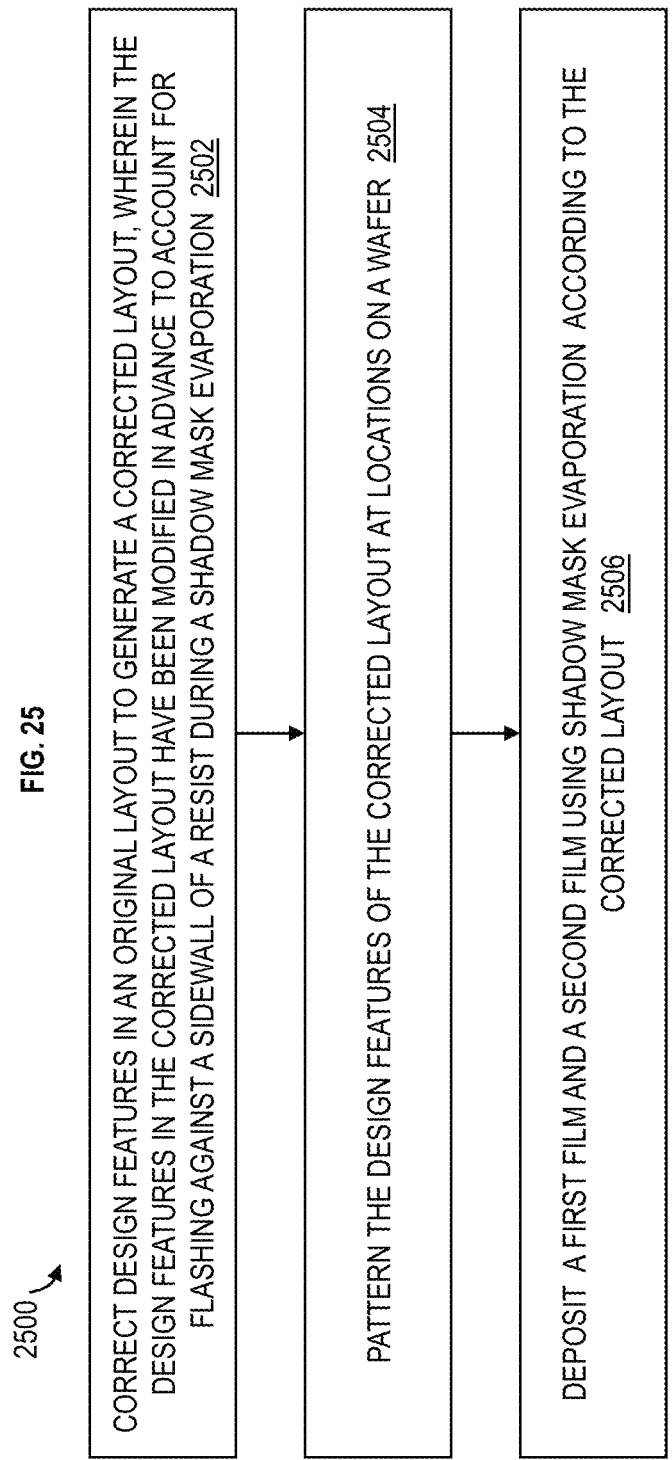

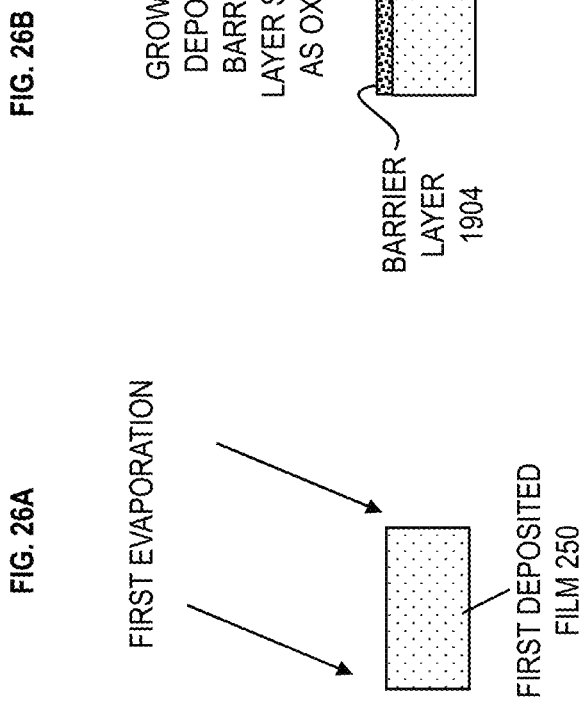
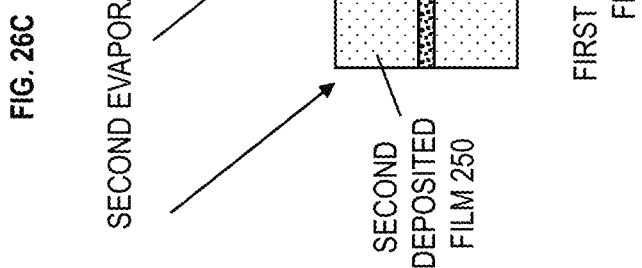

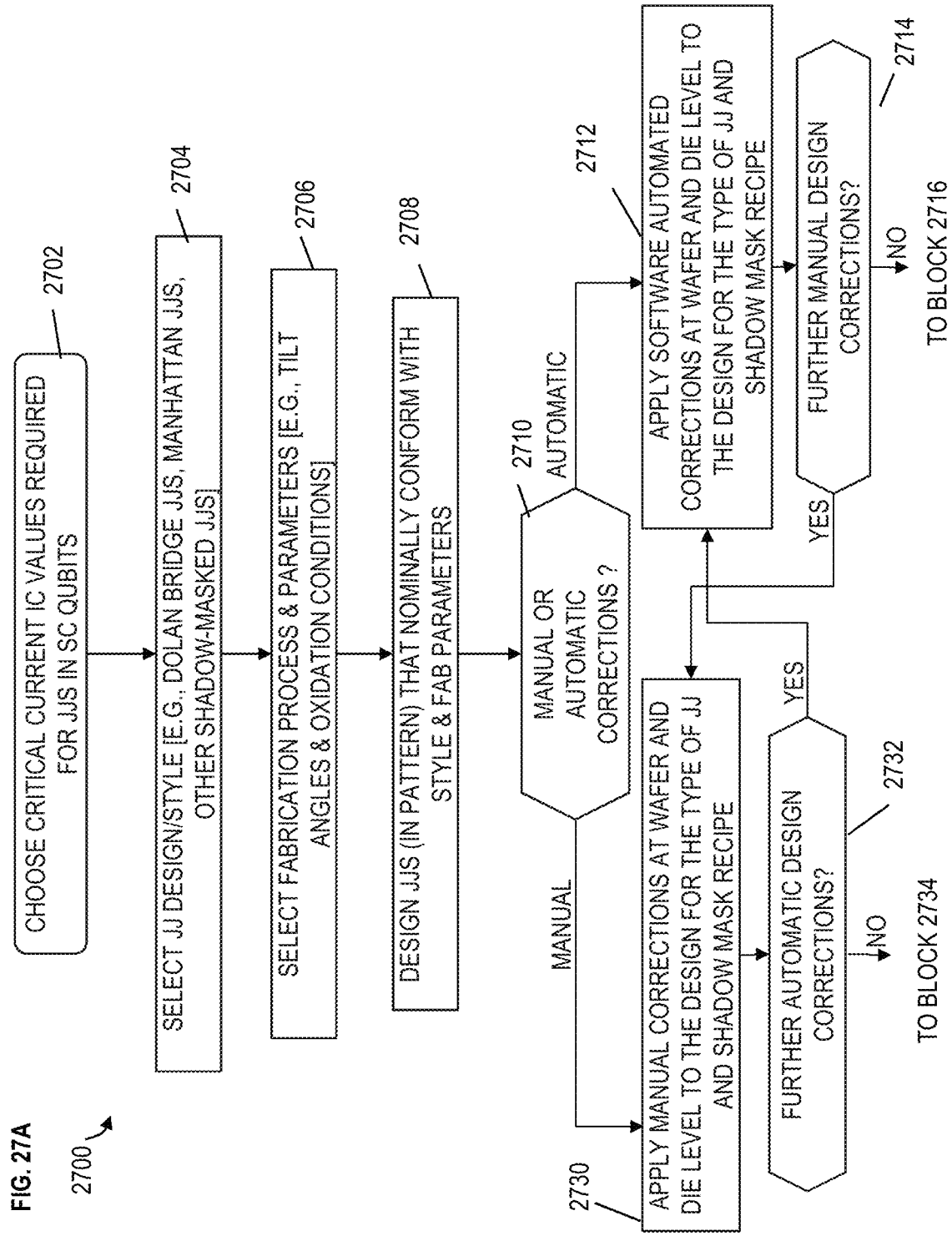

SHADOW MASK AREA CORRECTION FOR TUNNEL JUNCTIONS

DOMESTIC PRIORITY

This application is a continuation of U.S. patent application Ser. No. 15/805,306, filed Nov. 7, 2017, the disclosure of which is incorporated by reference herein in its entirety.

BACKGROUND

The present invention generally relates to superconducting devices. More specifically, the present invention relates to shadow mask area correction for tunnel junctions in quantum computing applications.

Evaporation is used in microfabrication. Evaporation is a common method of thin-film deposition in which the deposition source material is evaporated in a vacuum. During evaporation, a hot source material evaporates and then condenses back to a solid state on the target object (sample). Because the evaporation takes place in a vacuum, vapors other than the source material are almost entirely removed before the process begins. In a high vacuum (with a long mean free path), evaporated particles can travel directly to the deposition target without colliding with the background gas. At a typical pressure of $10^{-4}$ Pascals (Pa), a 0.4 nanometer particle has a mean free path of 60 meters. Evaporated atoms that collide with foreign particles can react with them. For example, if aluminum is deposited in the presence of oxygen, it will form aluminum oxide. Evaporated materials deposit non-uniformly if the substrate has a rough surface (as integrated circuits often do). Because the evaporated material attacks the substrate mostly from a single direction, protruding features block the evaporated material from some areas. This phenomenon is called "shadowing" or "step coverage."

A common technique for the fabrication of Josephson junctions (JJs) involves double-angle shadow evaporation of aluminum through an offset mask, wherein the tunnel barrier is formed by the diffusive oxidation of the aluminum base layer. Shadow evaporation has been the most successful fabrication approach to date for making long-lived, high-coherence superconducting quantum bits (or qubits).

The Niemeyer-Dolan technique, also called the Dolan technique or the shadow evaporation technique, is a thin-film lithographic method to create nanometer-sized overlapping structures. This technique uses an evaporation mask that is suspended above the substrate. The evaporation mask can be formed from two layers of resist. Depending on the evaporation angle, the shadow image of the mask is projected onto different positions on the substrate. By carefully choosing the angle for each material to be deposited, adjacent openings in the mask can be projected on the same spot, creating an overlay of two thin films with a well-defined geometry. Another technique for fabricating an overlay of two thin films during lithography is known as a Manhattan crossing, named as such because it has intersecting streets and avenues at right angles. In this technique, an evaporation is first done along an avenue at a tilt angle that is typically steeper than that used for a Dolan. This results in deposition of material along the avenue but no deposition within the street because all the material evaporated into the street is intercepted by the evaporation mask such as a resist. The crossing is then formed by performing a similarly steep subsequent evaporation along the street. No material is evaporated within the avenue in the subsequent evaporation because all the material evaporated into the avenue is again intercepted by the evaporation mask. The only area not protected by the evaporation mask is the intercept between the street and the avenue, resulting in a Manhattan crossing overlay.

New shadow mask evaporation techniques are needed to form tunnel junctions, such as Josephson junctions for superconducting quantum computing applications. In particular, new techniques are sought which can reduce variability of fabrication.

SUMMARY

Embodiments of the present invention are directed to a method for correcting an area of overlap between two films created by sequential shadow mask evaporations. A non-limiting example of the method includes performing at least one process selected from the group consisting of: correcting design features in an original layout to generate a corrected layout using a software tool, such that the corrected layout modifies shapes of the design features and correcting the design features in the original layout to generate the corrected layout using a lithographic tool, such that the corrected layout modifies the shapes of the design features. The method includes patterning the modified shapes of the design features at locations on a wafer according to the corrected layout using the lithographic tool. Also, the method includes depositing a first film by an initial shadow mask evaporation and a second film by a subsequent shadow mask evaporation to produce corrected junctions at the locations on the wafer, such that the first and second films have an overlap.

Embodiments of the invention are directed to a method of forming junctions. A non-limiting example of the method includes correcting design features in an original layout to generate a corrected layout, patterning the design features of the corrected layout at locations on a wafer, and depositing a first film and a second film using shadow mask evaporation according to the corrected layout, the corrected layout being corrected for deposition by the shadow mask evaporation.

Embodiments of the present invention are directed to a method for correcting an area of overlap between two films created by sequential shadow mask evaporations. A non-limiting example of the method includes correcting design features in an original layout to generate a corrected layout, where the design features in the corrected layout have been modified in advance to account for being at different positions relative to an evaporation source. The method includes patterning the design features of the corrected layout at locations on a wafer and depositing a first film and a second film using shadow mask evaporation according to the corrected layout.

Embodiments of the present invention are directed to a method for correcting an area of overlap between two films created by sequential shadow mask evaporations. A non-limiting example of the method includes correcting design features in an original layout to generate a corrected layout, where the design features in the corrected layout have been modified in advance to account for sidewall deposits of material on the design features from an evaporation source. The method includes patterning the design features of the corrected layout at locations on a wafer and depositing a first film and a second film using shadow mask evaporation according to the corrected layout.

Embodiments of the invention are directed to a method for correcting an area of overlap between two films created by sequential shadow mask evaporations. A non-limiting example of the device includes correcting design features in an original layout to generate a corrected layout, where the design features in the corrected layout have been modified in advance to account for flashing against a sidewall of a resist during a shadow mask evaporation. The method includes patterning the design features of the corrected layout at locations on a wafer and depositing a first film and a second film using the shadow mask evaporation according to the corrected layout.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a top view of the left die in FIG. 1 according to embodiments of the present invention;

FIG. 2B depicts a cross-sectional view along the dashed line in FIG. 2A according to embodiments of the present invention;

FIG. 2C depicts a top view of the center die in FIG. 1 according to embodiments of the present invention;

FIG. 2D depicts a cross-sectional view along the dashed line in FIG. 2C according to embodiments of the present invention.

FIG. 3A depicts a top view of the left die in FIG. 1 according to embodiments of the present invention;

FIG. 3B depicts a cross-sectional view along the dashed line in FIG. 3A according to embodiments of the present invention;

FIG. 3C depicts a top view of the center die in FIG. 1 according to embodiments of the present invention;

FIG. 3D depicts a cross-sectional view along the dashed line in FIG. 3C according to embodiments of the present invention;

FIG. 5A depicts a top view of the top die in FIG. 4 according to embodiments of the present invention;

FIG. 5B depicts a cross-sectional view along the dashed line in FIG. 5A according to embodiments of the present invention;

FIG. 5C depicts a top view of the center die in FIG. 4 according to embodiments of the present invention;

FIG. 5D depicts a cross-sectional view along the dashed line in FIG. 5C according to embodiments of the present invention;

FIG. 7A depicts a top view of the left die in FIG. 6 according to embodiments of the present invention;

FIG. 7B depicts a cross-sectional view of the left die in FIG. 6 along the dashed line in FIG. 7A according to embodiments of the present invention;

FIG. 7C depicts a top view of the center die in FIG. 6 according to embodiments of the present invention;

FIG. 7D depicts a cross-sectional view of the center die in FIG. 6 along the dashed line in FIG. 7C according to embodiments of the present invention;

FIG. 8A is a top view of the left die in FIG. 6 according to embodiments of the present invention;

FIG. 8B is a cross-sectional view of the left die in FIG. 6 along the dashed line in FIG. 8A according to embodiments of the present invention;

FIG. 8C is a top view of the center die in FIG. 6 according to embodiments of the present invention;

FIG. 8D is a cross-sectional view of the center die in FIG. 6 along the dashed line in FIG. 8C according to embodiments of the present invention;

FIG. 9A is a top view of the center die according to embodiments of the present invention;

FIG. 9B is a cross-sectional view of the center die according to embodiments of the present invention;

FIG. 10A is a top view of the center die according to embodiments of the present invention;

FIG. 10B is a cross-sectional view of the center die according to embodiments of the present invention;

FIG. 11A is a simplified top view of the stage holding the wafer according to embodiments of the present invention;

FIG. 11B is a top view of the left die in FIG. 11A according to embodiments of the present invention;

FIG. 11C is a simplified top view of the stage holding the wafer according to embodiments of the present invention;

FIG. 11D is a top view of the left die in FIG. 11C according to embodiments of the present invention;

FIG. 12A is a simplified top view of the stage holding the wafer according to embodiments of the present invention;

FIG. 12B is a top view of the rotated left die in FIG. 12A according to embodiments of the present invention;

FIG. 13A is a simplified top view of the stage holding the wafer according to embodiments of the present invention;

FIG. 13B is a top view of the left die in FIG. 13A according to embodiments of the present invention;

FIG. 13C is a simplified top view of the stage holding the wafer according to embodiments of the present invention;

FIG. 13D is a top view of the left die in FIG. 13C according to embodiments of the present invention;

FIG. 14A is a simplified top view of the stage holding the wafer according to embodiments of the present invention;

FIG. 14B is a top view of the rotated left die in FIG. 14A according to embodiments of the present invention;

FIG. 16A depicts a top view of the left die in FIG. 15 according to embodiments of the present invention;

FIG. 16B depicts a cross-sectional view of the left die in FIG. 16A according to embodiments of the present invention;

FIG. 17A depicts a top view of the left die in FIG. 15 according to embodiments of the present invention;

FIG. 17B depicts a cross-sectional view of the left die in FIG. 17A according to embodiments of the present invention;

FIG. 18A depicts a top view of the left die in FIG. 15 according to embodiments of the present invention;

FIG. 18B depicts a cross-sectional view of the left die in FIG. 17A according to embodiments of the present invention;

FIG. 19 depicts a cross-sectional view completed Josephson junctions according to embodiments of the present invention;

FIG. 23 depicts a flow chart of a method of correcting an area of overlap between two films created by sequential shadow mask evaporations according to embodiments of the present invention;

FIG. 24 depicts a flow chart of a method of correcting an area of overlap between two films created by sequential shadow mask evaporations according to embodiments of the present invention;

FIG. 25 depicts a flow chart of a method of correcting an area of overlap between two films created by sequential shadow mask evaporations according to embodiments of the present invention;

FIG. 26A depicts a first shadow mask evaporation according to embodiments of the present invention;

FIG. 26B depicts deposition of an oxide layer according to embodiments of the present invention;

FIG. 26C depicts a second shadow mask evaporation according to embodiments of the present invention;

FIG. 27A depicts a flow chart of a process for automated and/or manual corrections in fabricating Josephson junctions (JJs) according to embodiments of the present invention.

Figure 1:
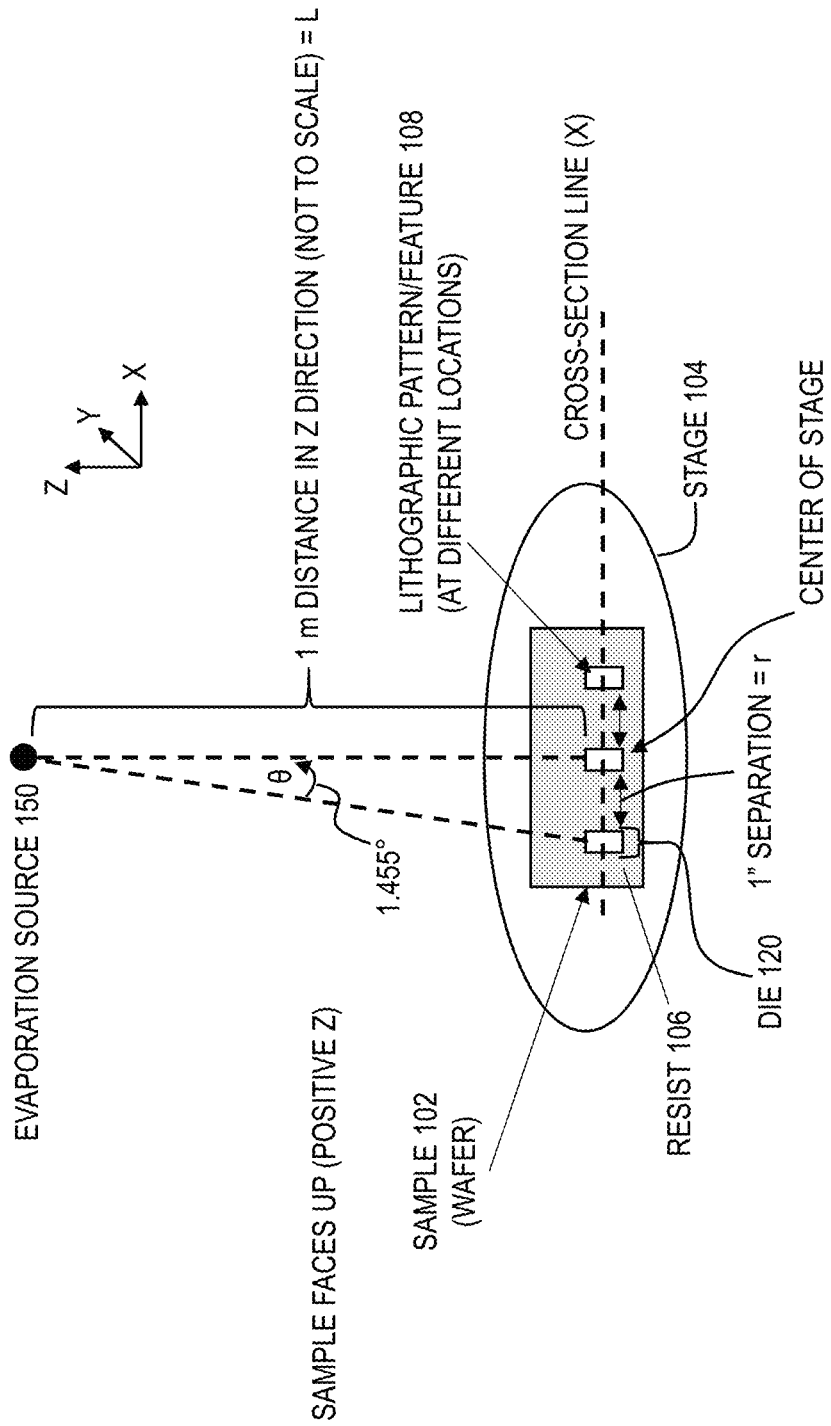
FIG. 1 depicts a perspective view of fabricating Josephson junctions according to embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, technologically-relevant tunnel junctions for application in quantum computing are made with superconductors and have dimensions of about 100 nanometers on a side. The two main types of tunnel junctions utilized by researchers in the field of quantum computing are obtained by the Dolan Bridge or Manhattan techniques. A tunnel junction made by the Dolan Bridge technique is referred to as a Dolan junction, while a tunnel junction made by the Manhattan technique is referred to as a Manhattan junction. A Manhattan junction can be fabricated utilizing a pattern known as a Manhattan crossing during lithography, named as such because it has intersecting streets and avenues at right angles.

Turning now to an overview of the aspects of the invention, one or more embodiments of the invention address the above-described shortcomings of the prior art by providing methods for shadow mask area correction for Josephson tunnel junctions (JJs) used in superconducting quantum computing applications. The Josephson junction area is dominated by the width of a layer such as the deposited film or a pre-existing fin. As used in embodiments of the present invention, shadow mask or angle evaporation are fabrication techniques that can be utilized in making high quality superconducting qubits. A Josephson junction is a type of tunnel junction, which consists of superconducting metal on either side of a weak link, such as an oxide layer (known as a tunnel barrier), a short section of non-superconducting metal, or a physical constriction in a superconductor. The superconducting metal (instead of regular metal) makes a Josephson junction a special type of tunnel junction. A superconducting qubit is a special case of a qubit and is made using one or more Josephson junctions. Therefore, the Josephson junction is the required component of a superconducting qubit. Other qubits exist but are not made of Josephson junctions.

More specifically, the above-described aspects of the invention address the shortcomings of the prior art by techniques to correct shadow mask evaporation in superconducting quantum circuits, which corrects the high variability in the tunnel junction lithographic area thereby correcting the variability of the tunnel current $I_c$. Josephson tunnel junctions utilized in superconducting quantum circuits are typically made with multiple shadow mask evaporations. These evaporation steps utilize a combination of multiple tilt and rotation angles, multiple shadow masking techniques (bridge or bridgeless), and an intermediary in-situ oxidation step without breaking vacuum. The resulting critical currents ($I_c$) exhibit high variability across a large sample/wafer. Variation in total tilt angle is often assumed to be negligible for fabrication purposes because the distance between the source and sample is $10^7$ times larger than the typical junction lithographic dimensions (1 meter (m) distance versus a 100 nanometer (nm) feature size). However, this assumption has been found to be incorrect in multiple experiments. Particularly, for technologically-relevant junction fabrication, evaporation typically originates from a point source, while the sample must be considered as an extended target. The results of several experiments have also found the variation in total tilt angle to be predictable. Therefore, embodiments of the present invention have been designed and implemented as methods to correct the systematic variability in junction area from shadow evaporation across an extended sample. Critical current ($I_c$) of a Josephson junction is best predicted by the area of the tunnel junction (for a given oxidation condition). Embodiments of the present invention provide methods to correct the area variability induced by the shadow mask tilt angle. Correction of the shadow mask tilt angle can include a set of design (layout), lithographic, and/or process steps. For example, the undercut of the resist as implemented in design can be corrected for position on the wafer, type of shadow mask technique, and sample size (amount of repeated features on the wafer). The feature sizes implemented in design can also be corrected with the same considerations. Alternatively or complementarily with design, the lithographic pattern can include an algorithm (in addition to others, such as optical proximity correction (OPC)) to correct the exposure of the undercut and the feature size under the same considerations along with accounting for the choice of resist thickness and layers. In conjunction with the previous two types of corrections (design and lithographic), the tilt and rotation angles can be corrected to produce the greatest uniformity across the extended target during evaporation, taking into account evaporated film thicknesses as well, which constitutes a process correction. This methodology can be extended to other types of tunnel junctions with similar requirements and can be automated in design and/or lithography (for fixed process parameters), thereby providing a path for large-scale processing.

Turning now to a more detailed description of aspects of the present invention, FIG. 1 depicts a perspective view of fabricating Josephson junctions (JJs) according to embodiments of the present invention. For simplicity, three lithographic patterns/features 108 (left, center, and right pattern) are shown in FIG. 1, and each lithographic feature 108 results in a die 120 (e.g., left die 120, center die 120, and right die 120). A die 120 may also be referred to as a chip 120. FIG. 2A is a top view of the left die according to embodiments of the present invention. FIG. 2B is a cross-sectional view of the left die according to embodiments of the present invention. FIG. 2C is a top view of the center die according to embodiments of the present invention. FIG. 2D is a cross-sectional view of the center die according to embodiments of the present invention.

A resist layer 106 is deposited on a substrate 102. The resist layer 106 can be a single or bilayer resist, can include one or more underlayers, such as an anti-reflective coating (ARC), a planarizing layer, or hardmask materials, or can be another stack including a resist, as understood by one skilled in the art. In some implementations having a bilayer resist, a bottom resist layer 206 is deposited on the substrate 102, and the top resist layer 106 is formed on the bottom resist layer 206. The resist layer 106 is patterned in an exemplary shape of the lithographic feature 108, and for explanation purposes, the shape of 108 is a trench. In some implementations, the resist layer 106 can be patterned with a lithographic feature 108, for example, to have a Manhattan crossing of trenches that expose the substrate 102 as understood by one skilled in the art.

The substrate 102 can be a wafer on a wafer stage 104, and the wafer stage holds and moves the wafer 102 substrate during the fabrication as understood by one skilled in the art. The terms sample and wafer are used interchangeably. An evaporation source 150 is used to deposit a film layer 250, such as a superconducting metal. In shadow-masking techniques, the sample 102 and source 150 are tilted relative to each other. This is usually accomplished by tilting the sample stage 104 while keeping the source 150 fixed. The sample 102 is also aligned relative to the stage 104 so that the evaporation can occur along an opening in the resist 106 and 206, usually along the long direction of the trench. The typical distance L between the source 150 and sample 102 is (relatively) long, e.g., 1 meter (m) (called "throw"). A chip that is at a distance r equals 1 inch (") from the center of the stage 104 has an angle deviation of 1.455° away from the direct line of sight from the evaporation source 150 (geometrically), as shown for example in FIG. 1.

As an example scenario for explanation purposes, the typical resist is a bilayer. For example, the thickness of the bottom resist layer 206 used for undercut (among possible other purposes) can be about 300 nm in the z-axes and the thickness of the top resist layer 106 can be about 200 nm. The total bilayer resist thickness can be about 500 nm. For the chip that is about r=1" away from the center of the stage 104, the 1.455° sideway evaporation will displace the pattern by 500 nm×Tan(1.455°)~13 nm from the right resist edge of FIG. 2B, by 300 nm×Tan(1.455°)~8 nm from the left resist edge of FIG. 2B. and shrink its width (for the feature on the left die 120 or right die 120) in the x-axis by a net of 200 nm×Tan(1.455°)~5 nm. This is a negligible offset for 1 micron (μm) features, corresponding to 0.5% of the 1 um width, but is non-negligible for 100 nm features (such as lithographic features 108), corresponding to 5% of the 100 nm width. As such, the shrinking of the trench opening in the left and right features 108 increases linearly with distance to the center for larger samples (as long as r<<L). In the example above, the feature width of film 250 is reduced from 100 nm in the center die 120 as shown in FIG. 2D to 95 nm (5%) in the left die 120 in FIG. 2B. The error will increase by roughly 5% for every inch away from the center of the stage 104. In other words, the same reduction in film width of film 250 in the x-axis will occur for the right die 120, and any other dies 1 inch away from the center. This reduction in film width of evaporated film 250 increases further away from the center.

During evaporation from the evaporation source 150 with respect to the left die, the superconducting material is deposited on top of the top resist layer 106 as a top deposit layer 208, deposited on the side of the top resist layer 106 as a sidewall deposit 202, and deposited in the opening of the top and bottom resist layers 106 and 206 as film layer 250 with width of 95 nm (as depicted in FIG. 2B). However, there is no sidewall deposit 202 in the center die and the film layer 250 has a full width of 100 nm, as depicted in FIG. 2D. The downward arrows represent evaporation (i.e., deposition) of the superconducting material from the evaporation source 150. For simplicity, no top deposit 208 is shown in top views of FIGS. 2A, 2C, 3A, 3C, 5A, 5C, 7A, 7C, 8A, 8C, 9A, 10A, 11A, 11B, 11C, 11D, 12A, 12B, 12C, 13A, 13B, 13C, 13D, 14A, 14B, 16A, 17A, and 18A.

Non-limiting examples of suitable materials for the substrate 108 include Si (silicon), strained Si, high-resistivity Si, float-zone Si, SiC (silicon carbide), Ge (germanium), SiGe (silicon germanium), SiGeC (silicon-germanium-carbon), Si alloys, Ge alloys, III-V materials, $Al_2O_3$ (sapphire, corundum), $SiO_2$ (quartz), etc.

The pattern in the resist layers 106 and 206 can be achieved by lithographic patterning which is followed by development of the resist layers 106 and 206. In one case, the patterning of the trenches can be by photolithographic patterning which patterns the resist 106, 206 on the substrate 102, and the development process can be, for example, with a tetramethylammonium hydroxide (TMAH) or solvent developer. Additional developers are generally known in the art. The pattern of trenches in the resist layers 106 and 206 can alternatively be performed by lithographic patterning and followed by an etching. In one case, the patterning of the trenches can be by photolithographic patterning that exposes portions of the resist 106 and 206 on the substrate 102, and the etching process can be, for example, a wet or reactive ion etching process that removes exposed portions of the resist 106 and 206 in order to form desired patterns discussed herein.

Additionally, it should be noted that junctions in embodiments of the invention can be made with a single step of lithography. By not having multiple steps of lithography, embodiments of the present invention do not need to remove the resist or perform lift off in between evaporation steps, and then spin resist again and expose another lithographic pattern. Rather, embodiments of the present invention are specifically designed to be used with a single patterning step and multiple evaporations/oxidations done without breaking vacuum in the same evaporator. At least 2 types of corrections to be described further can be implemented for a single shadow mask lithographic step. Additionally, it should be understood that any material on top of the resist layers 106 and 206 will eventually be lifted off when the resist layer 106 and 206 are removed except where noted otherwise. Likewise, it should be understood that any material attached only to the sidewall of the resist layer 106 and 206, as opposed to being attached to another surface (such as the substrate 101 or another evaporated film which is anchored on the surface), will eventually be lifted off when the resist layers 106 and 206 are removed except where noted otherwise. It should be understood that lift off is a way to finish the device. Lift off can be performed by using a solvent, such as Dow® Microposit™ Remover or acetone, to remove the resist layer at the end, along with any materials that are attached to the resist but nothing else. One skilled in the art understands how to perform lift off.

A photoresist is a light-sensitive material. A positive resist is a type of photoresist in which the portion of the photoresist that is exposed to light becomes soluble to the photoresist developer. The unexposed portion of the photoresist remains insoluble to the photoresist developer. In a complementary manner to positive photoresist, a negative photoresist is a type of photoresist in which the portion of the photoresist that is exposed to light becomes insoluble to the photoresist developer. The unexposed portion of the photoresist is dissolved by the photoresist developer.

Additionally, embodiments of the present invention can utilize electron-beam lithography (often abbreviated as e-beam lithography) which is the practice of scanning a focused beam of electrons to draw custom shapes (i.e., exposing) on a surface covered with an electron-beam-sensitive film called an electron-beam (or e-beam) resist. The electron beam changes the solubility of the electron-beam resist, enabling selective removal of either the exposed or non-exposed regions of the resist by immersing it in a developer (e.g., a specific solvent). The purpose, as with photolithography, is to create very small structures in the resist that can subsequently be transferred to the substrate material, often by etching or deposition. Non-limiting examples of suitable electron-beam resists include Poly (methyl methacrylate) (PMMA), which is a type of positive electron-beam resist, and Hydrogen silsesquioxane (HSQ), which is a type of negative electron-beam resist. Analogous to photoresist, a positive electron-beam resist is a type of resist in which the portion of the resist that is exposed to the electron beam (as opposed to light) becomes soluble to the electron-beam resist developer. The unexposed portion of the electron-beam resist remains insoluble to the electron-beam resist developer. On the other hand, a negative electron-beam resist is a type of resist in which the portion of the resist that is exposed to the electron beam (as opposed to light) becomes insoluble to the electron-beam resist developer. The unexposed portion of the electron-beam resist is dissolved by the electron-beam resist developer. Other methods for performing e-beam lithography, for example but not limited to using lift off resist (LOR) or electron-beam resist bilayers, are understood by one skilled in the art.

Using the example scenario, non-limiting examples for several types of corrections are discussed herein. For combinations of multiple corrections, one can build a more specific model. There can be other corrections that are within the spirit of the invention, but not explicitly discussed. Custom correction models can be built using the ideas presented. In the example scenario, provided are area correction methods for shadow evaporations, and designers apply it specifically to Josephson junctions used in quantum computing, where the critical current ($I_c$) of the junction is sensitive to the area (and oxide or barrier thickness) of the junction. The discussed corrections specify the pattern/dose adjustments needed to achieve the desired feature size/area. This can be implemented in a way that does not necessarily preserve the exact (original) position/coordinates of the structure (within a die). Alternatively and additionally, it can also be implemented in a particular way that does preserve the feature coordinates (also within a die, optional).

Automated corrections can be implemented at the post processing or fracture stage, either in house (e.g., at mask design shops) or in commercial packages, such as CATS or Beamer. For explanation purposes and ease of understanding, the corrections are categorized into the following non-limiting categories:

1. Positional tilt corrections;
2. Sidewall deposit corrections (that reduce the channel width for subsequent evaporations (i.e., after a first evaporation)); and
3. Sidewall flashing corrections (by means of undercut engineering or pattern/dose corrections).

Positional tilt corrections discussed herein address corrections along the x or y axis, and any combination thereof can be a vector decomposed into these 2 component corrections (i.e., x and y axes).

A single sidewall deposit correction requires 2 evaporation steps. Multiple sidewall deposit corrections (for 3 or more evaporation steps) in the same trench could require detailed considerations in accordance with embodiments of the present invention, by which a custom model can be generated.

Flashing corrections could require a detailed quantitative understanding of the developed resist profile for the particular process. Possible solutions/corrections include: increasing the available undercut such that flashing does not (or only minimally) occur by undercut engineering, and/or locally correcting the pattern or dose (as discussed in positional corrections) to compensate for reduced feature size due to sidewall flashing.

For explanation purposes, subheading and subtitles are utilized to ease understanding and not for limitation. As noted above, the example scenario explained depicts differences between the center die 120 and the left die 120 along with the particular corrections that are provided. It should be appreciated that the corrections can be made to dies 120 in any location in an array of dies (e.g., hundreds or thousands) on the wafer 102 without undue experimentation, according to embodiments of the present invention.

1. Positional Tilt Corrections

Test case 1A is depicted as FIGS. 1, 2A, 2B, 2C, and 2D, and can be corrected using pattern and dose corrections. In this example, the designers correct the pattern exposed on the left such that the developed channel becomes wider and the evaporation on this left die results in 100 nm film width as depicted in FIGS. 3A, 3B, 3C, and 3D.

Figure 20:
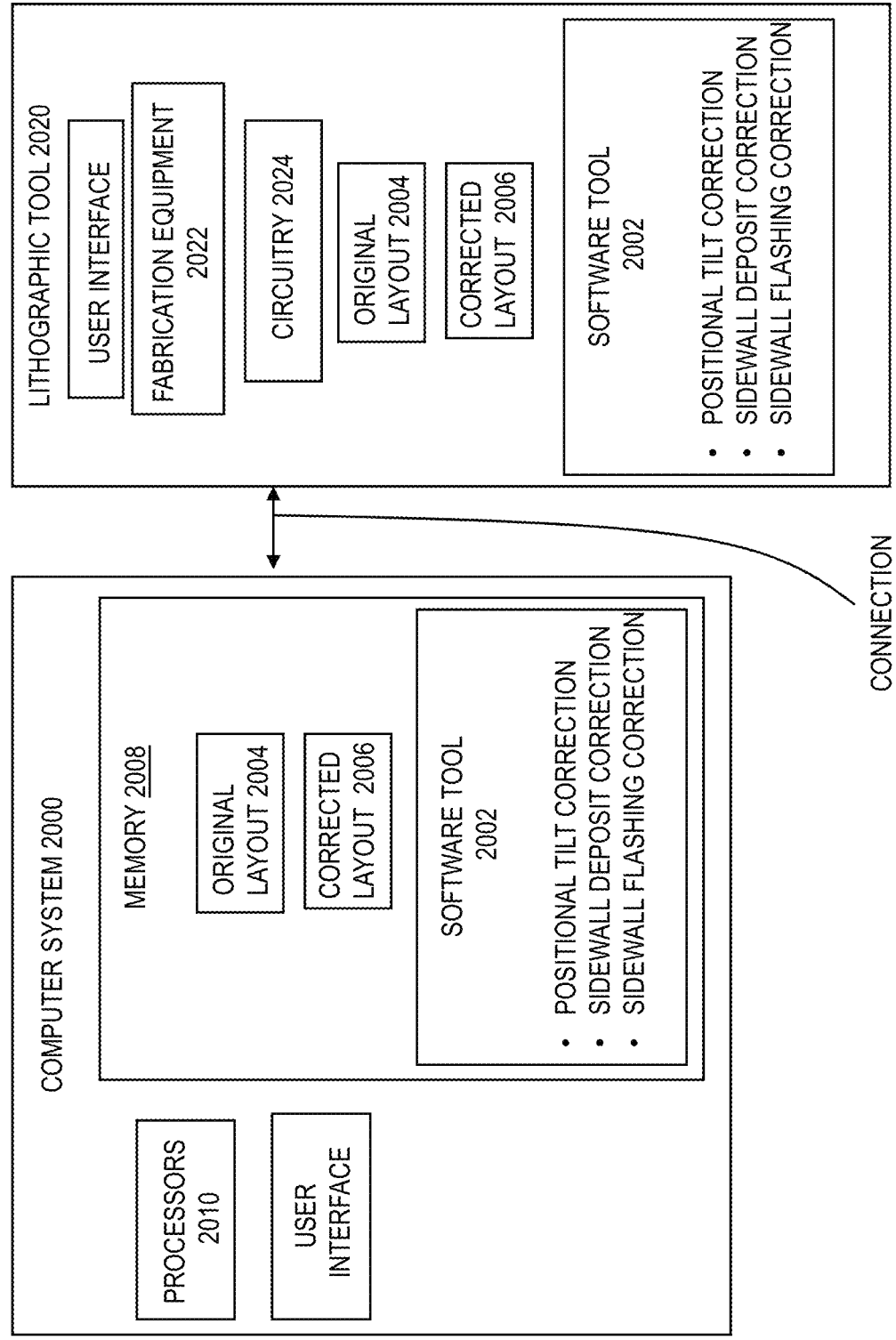
FIG. 20 depicts a system for correcting the area of Josephson junctions formed using shadow mask evaporations according to embodiments of the present invention.

In FIGS. 2A, 2B, 2C, and 2D, the positional tilt angle $\theta = \text{Tan}^{-1}$ (r/L), where r is the distance between the evaporation target on the sample and the stage center, and L is the distance between the stage center and the evaporation source. For r=1 inch=25.4 millimeters (mm) from center of the stage 104 (which is the center of the wafer 102) to the evaporation target on the sample/wafer 102, and for L=1 m=1000 mm from the evaporation source 150 to the center of stage 104 (i.e., to the wafer 102), the positional tilt angle $\theta = 1.455°$. By construction, $\theta = 0$ at the center of the stage 104 (which is the center of the wafer 102). The left die 120 (i.e., left lithographic feature) has positional tilt because the left die 120 is not positioned at the center of the wafer 102/stage 104, and the evaporation source 150 is aligned directly to the center of the wafer 102/stage 104. The left die 120 is to the left by 1 inch (in this example), and therefore, the positional tilt angle $\theta = 1.455°$ relative to the evaporation source 150. As shown in FIGS. 2A and 2B for the left die, the trench is 100 nm wide and a film is to be deposited on the substrate 102 with a 100 nm width just like the center die in FIG. 2D (at the center of the wafer 102/stage 104). However, because the left die is 1 inch away from the center of the wafer 102/stage 104 as shown in FIG. 1, shadow mask evaporation by the evaporation source 150 results in a sidewall deposit 202 which reduces the width of trench (in the x-axis) such that the depositing superconducting film 250 has a width of 95 nm in the left die in FIG. 2B instead of the desired 100 nm width (of film 250) in the center die in FIG. 2D. This type of problem is referred to as positional tilt, which is corrected with a positional tilt width correction $w_{pos}$ (to be added to the desired total width) in accordance with embodiments in the invention. Positional tilt can be corrected for by using pattern corrections and dose corrections. For positional tilt corrections, sidewall deposit corrections, and sidewall flashing corrections, a software tool 2002 (having the logic and algorithms) in FIG. 20 is configured to make each of the corrections in integrated circuit mask layout, lithographic equipment, and shadow mask equipment, in accordance with embodiments of the invention. Integrated circuit layout, also known IC layout, IC mask layout, or mask design, is the representation of an integrated circuit in terms of planar geometric shapes which correspond to the patterns of metal, oxide, semiconductor layers, superconducting layers, etc., that make up the components of the integrated circuit.

First Solution 1A (to Test case 1A): For pattern corrections, with respect to the pattern feature size of the lithographic feature 108 (i.e., the trench), the designers widen the resist opening (i.e., widen the trench) on the left die only to result in 100 nm width of the film 250 in FIG. 3B by local design modification in the layout (e.g., layout 2004) (which can be performed by software tool 2002). In this example, the positional tilt width correction implies a $w_{pos}$=5 nm wider opening of the lithographic feature 108 (i.e., trench) which will result in a 100 nm wide superconducting film 250 in FIG. 3B, and this is a local design adjustment because the adjustment only occurs to the left die 120 and not the center die 120. Analogously, the same positional tilt correction is made to the right die 120 (although this correction is not shown). The software tool 2002 can be configured to implement a single unique solution for each die on the wafer 102, and smaller corrections can be introduced within a die. According to embodiments of the present invention, this solution can be implemented manually by the designer in the layout 2004 (which may or may not utilize software tools 2002) and/or the solution can be implemented by a software algorithm of the software tool 2002 after layout 2004 of the desired pattern has been designed. Additionally, the solution can be implemented instead by the lithographic patterning tool 2020 depicted in FIG. 20. The lithographic patterning tool 2020 is lithographic equipment that forms a feature or pattern in one or more layers, as understood by one skilled in the art. In one implementation, the lithographic patterning tool 2020 could be integrated with, include, and/or be instructed by the software tool 2002.

Second Solution 1A (to Test case 1A): For pattern dose corrections, a larger exposure dose results in a wider feature for positive tone resists (while a smaller exposure dose results in a wider feature for negative tone resists). By locally (i.e., die by die) adjusting the pattern dose (as can be done for e-beam lithography or a stepper/scanner), the feature width of feature 108 can be changed to the corrected size (i.e., the trench is changed to be 105 nm wide for the left die (and right die)). This can be accomplished using the software tool 2002 which can be connected to and/or integrated with the fabrication equipment for e-beam lithography and/or a stepper/scanner. This solution can utilize the same pattern design (which is the original layout 2004 of the lithographic features 108 in the layers 106, 206, 102) and same mask for the original layout of the lithographic features, but requires a local dose adjustment. A local dose adjustment means that each die 120 (each feature 108) can receive a different amount of exposure based on the die's distance from the center in order to create a larger width for the trench (i.e., lithographic feature 108). Smaller corrections can be introduced within a die (for e-beam and other direct write lithography). As noted above, the solution can be implemented by a software algorithm (in the software tool 2002) after layout (a representation of the design). The solution can be implemented instead by the lithographic patterning tool 2020, which can be instructed by, for example, the software tool 2002, and/or the software tool 2002 can be integrated with the lithographic patterning tool. The conversion factor from dose change (i.e., the amount of exposure) to feature size change needs to be calibrated for a specific tool (e.g., for e-beam lithography) and resist stack (the type of resist layers 106 and 206 and developer being utilized), which is understood by one skilled in the art without undue experimentation in light of the teachings of embodiments of the present invention. As noted herein, the feature 108 (such as the trench) is patterned in the resist layer 106 and 206 to have the desired width in the x-axis.

For first and second solutions 1A, further detail regarding the width correction of the lithographic pattern/feature 108 for shadow evaporation is discussed. The positional tilt width correction is $w_{pos} = t_{top} \times \text{Tan}(\theta)$, where $t_{top}$ is the nominal thickness of the top resist layer, and $\theta$ is the positional tilt angle relative to the vertical z direction. This expression is a geometrical consequence of the top layer 106 being engineered to be wider than bottom resist layer 206, therefore defining the effective opening of resist (in the absence of previous sidewall deposits or flashing, as will be discussed). In this example, the top resist layer is layer 106 with thickness $t_{top}$=200 nm in z-axes. The tilt shown on the left die ($\theta$=1.455°) is for a r=1" location to the left from the stage center in the x direction, and a L=1 m distance to the evaporation source 150 (aligned to the stage center), when there is no additional tilt about the y direction (in xz plane), while the feature 108 extends in the y direction. Accordingly, the positional tilt width correction $w_{pos}$=200 nm×tan (1.455°)~5 nm. Therefore, an additional 5 nm was added to the width of the trench (feature 108) using the first solution 1A (designed wider at left location) or second solution 1A (exposed with larger dose at left location than the center location), thereby resulting in the trench with a width of 105 nm.

Figure 6:
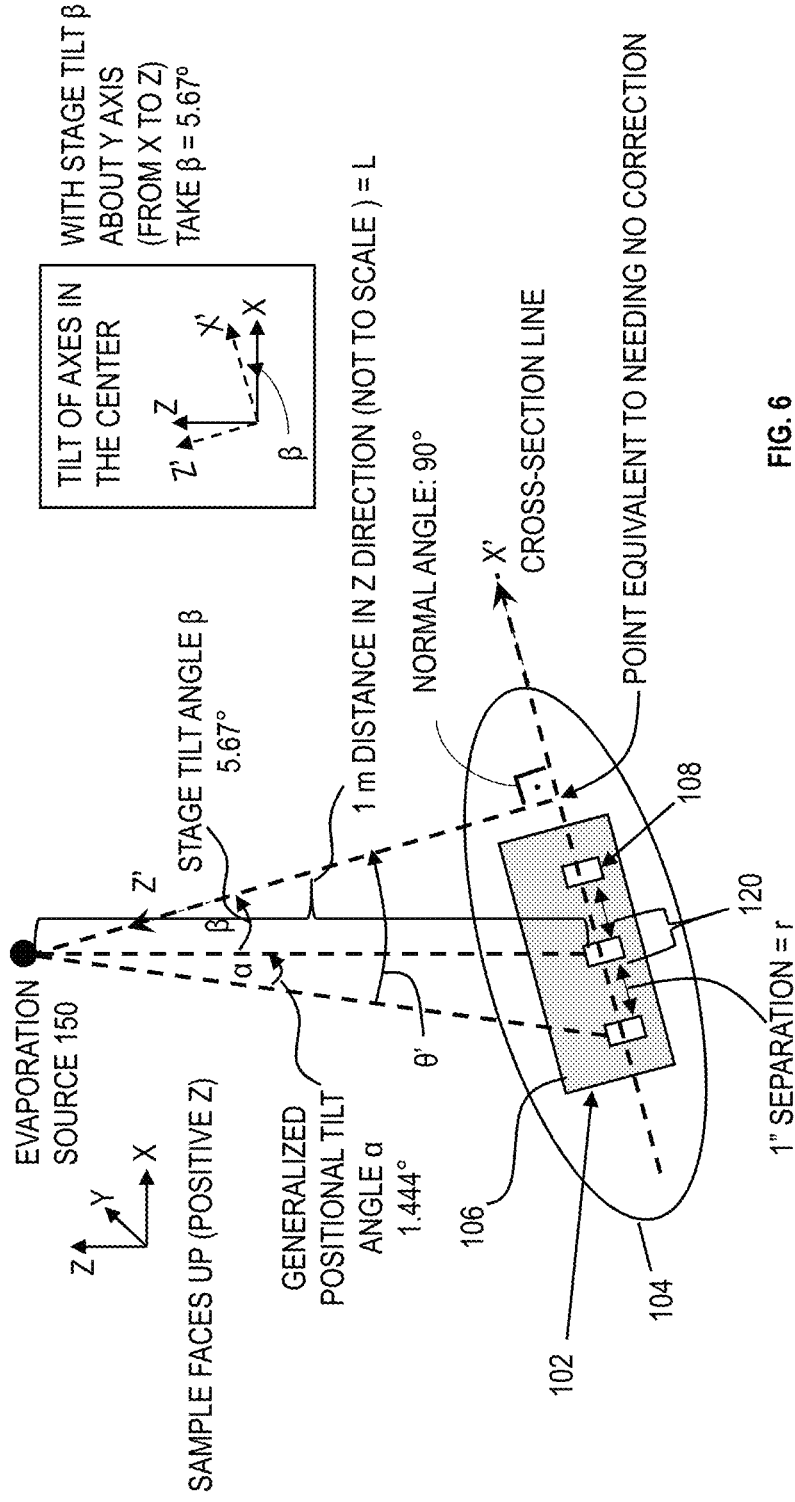
FIG. 6 depicts a perspective view of fabricating Josephson junctions according to embodiments of the present invention.

If there is an additional tilt about the y-axis (in the xz plane), the total tilt on the left die will be the y tilt +/− positional tilt, accordingly, though the exact value of the positional tilt angle may change (especially for large stage tilt angles), as detailed below; if stage 104 is tilted about the y-axis from x to z in the xz plane, the positional tilt θ is to be added to the stage tilt β, as shown in FIG. 6. However, if stage 104 is tilted in the y-axis from z to x in the xz plane instead, the positional tilt θ is to be subtracted from the stage tilt β. It is noted that x and y directions are arbitrary in the figures. Although the evaporation (for deposition of film 250) is shown on the z-axis, the evaporation direction can be along the x direction, for example (perpendicular to the feature). The axes shown represent a right-handed Cartesian coordinate system. The total tilt varies continuously across a wafer 102. Discretization of correction is arbitrary and only limited by software and error tolerances for a given application. Correction can vary along a same feature (street or avenue) if necessary (such as if the feature is very long, for example, and the error tolerance requires it).

For illustrative reasons, the positional tilt θ will be shown as being independent of the stage tilt β. This is true as long as the distance r between the center of the stage and the position on the wafer (1 inch) is much smaller than the distance L between the (aligned) center of the stage and the evaporation source (1 meter, aligned to each other), and as long as the stage tilt β is reasonably small (20° or less). Otherwise, the generalized positional tilt α for a stage tilt β about the y-axis in the xz plane is given by the formula $\alpha=\text{Tan}^{-1}[(r/L)\text{Cos}(\beta)/[1+(r/L)\text{Sin}(\beta)]]$. For β=0°, $\alpha=\text{Tan}^{-1}(r/L)=\theta$, by construction (no stage tilt, therefore total tilt $\theta'=\alpha+\beta=\alpha$). For β=90°, then α=0°, which corresponds to a completely vertical stage (there is only stage tilt, therefore total tilt $\theta'=\alpha+\beta=\beta$). For small stage tilt β (less than 20°) and r<<L, $\alpha=\text{Tan}^{-1}[(r/L)\text{Cos}(\beta)]\sim\text{Tan}^{-1}(r/L)=\theta$, which makes the total tilt $\theta'=\alpha+\beta\sim\theta+\beta$. The correction can utilize approximate formulas or the precise analytical expressions depending on the degree of precision required. It should also be noted that the stage tilt or positional tilt only matters for the purpose of area correction of the overlap between two deposited films if the area of the overlap is modulated by either type of tilt. In this example, if a stage tilt is performed about the x-axis instead, in the yz plane from y to z, the generalized positional tilt becomes independent of the stage tilt for trenches 108 that are parallel to the yz plane. This statement is true as long as the tip of the trenches 108 do not determine the overlap area (i.e., the overlap area is determined by a crossing away from the tips of the features such as trenches 108).

Figure 4:
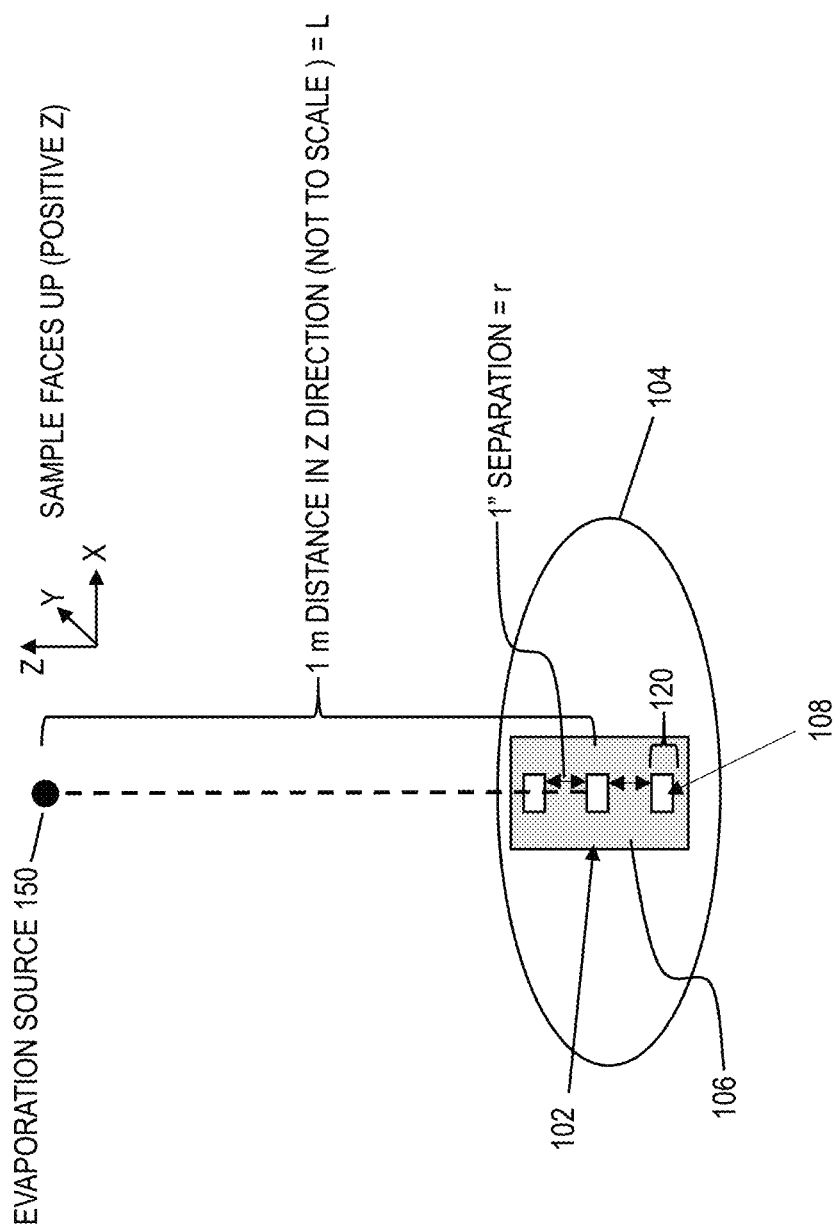
FIG. 4 depicts a perspective view of fabricating Josephson junctions according to embodiments of the present invention.

Test case 1B is depicted in FIGS. 4, 5A, 5B, 5C, and 5D, and can be corrected analogously using pattern and dose corrections as discussed above in test case 1A. In the test case 1B, the designers correct the pattern exposed on the top die such that the developed channel becomes wider in the y-axis and the evaporation on this top die results in a 100 nm film width (not shown but analogous to FIGS. 3A, 3B, 3C, and 3D). The test case 1B in FIG. 4 is the same as test case 1A except the stage 104 is rotated 90° relative to test case 1A. This means that the parameters and layers are the same in both FIG. 1 and in FIG. 4. FIG. 4 depicts lithographic patterns/features 108, and each lithographic pattern 108 results in a die 120 (e.g., top die 120, center die 120, and bottom die 120). FIG. 5A is a top view of the top die according to embodiments of the present invention. FIG. 5B is a cross-sectional view of the top die according to embodiments of the present invention. FIG. 5C is a top view of the center die according to embodiments of the present invention. FIG. 5D is a cross-sectional view of the center die according to embodiments of the present invention.

Test case 1B utilizes the same solutions as test case 1A except the solutions are in the other direction, i.e., the $w_{pos}$=5 nm increase is in the y-axis by pattern design and/or dose. For example, instead of the width increasing in the x-axis as depicted in FIGS. 3A and 3B, the width will increase in the y-axis with respect to FIGS. 4, 5A, 5B because of the narrower projection of the deposited film through the opening of the top resist layer 106.

Test case 1C is depicted as FIGS. 6, 7A, 7B, 7C, and 7D, and can be corrected using pattern and dose corrections as discussed above. In this example, the designers correct the pattern exposed on both the left and center dies such that the developed channel becomes wider and the evaporation on the left and center dies each result in 100 nm film width as depicted in FIGS. 8A, 8B, 8C, and 8D.

FIG. 6 depicts a perspective view of fabricating Josephson junctions according to embodiments of the present invention. FIG. 6 is similar to FIGS. 1 and 4 except for different angles. FIG. 7A depicts a top view of the left die in FIG. 6 according to embodiments of the present invention. FIG. 7B depicts a cross-sectional view of the left die in FIG. 7A according to embodiments of the present invention. FIG. 7C depicts a top view of the center die in FIG. 6 according to embodiments of the present invention. FIG. 7D depicts a cross-sectional view of the center die in FIG. 7C according to embodiments of the present invention. Test case 1C addresses stage tilt of the stage 104. This means that the stage 104 holding the wafer 102 has been tilted, and the amount/angle of stage tilt is β. To illustrate stage tilt, there are two sets of axes. The x, y, z axes as used herein and the x', y', z' axes representing the stage tilt. For explanation purposes, the state tilt β is about the y-axis from the x-axis to the z-axis in the xz plane. In this example, the stage tilt β=5.67°. There is already a positional tilt θ=1.455° for the left die with respect to the center die prior to tilting the stage, and the positional tilt θ is based on the r=1 inch separation between the lithographic features 108 (e.g., from the center of one trench to the center of the nearest trench) all of which is for a distance of L=1 m from the evaporation source 150 to the wafer 102/stage 104. Since the stage tilt β=5.67° is reasonably small (less than 20°) while r<<L, the generalized positional tilt α can be approximated by the positional tilt θ as α~θ=1.455° which is independent of the stage tilt β, and the total tilt will be taken as the sum or subtraction of the positional and stage tilts for simplicity depending on the direction of the stage tilt.

For a total tilt angle θ' with stage tilt β about the y-axis from the x-axis to the z-axis in the xz plane, the designers add positional tilt α to stage tilt β for left-of-center, and the designers subtract positional tilt α from stage tilt β for right-of-center (although the right die is not depicted, for simplicity). A closed formula for the total tilt angle $\theta'=\beta\pm\alpha=\text{Tan}^{-1}[[\text{Sin}(\beta)\pm(r/L)]/\text{Cos}(\beta)]$. As already discussed, the generalized positional tilt may not vary significantly with stage tilt, such that $\alpha \sim \theta$ as long as the stage tilt $\beta$ is reasonably small and the distance r on the wafer to its center is much smaller than the distance L to the evaporation source.

FIGS. 8A, 8B, 8C, and 8D depict the lithographic pattern/feature 108 with a wider pattern. FIG. 8A is a top view of the left die according to embodiments of the present invention. FIG. 8B is a cross-sectional view of the left die according to embodiments of the present invention. FIG. 8C is a top view of the center die according to embodiments of the present invention. FIG. 8D is a cross-sectional view of the center die according to embodiments of the present invention.

As discussed herein, to create the wider pattern for the trench (feature 108) in the x'-axis, the designers can design a wider trench at each location of the die 120 (first solution 1A) and/or expose (the resist) with a larger dose at each location of the die 120 (second solution 1A). A larger dose can be with a greater beam intensity (i.e., increased magnitude) and/or longer exposure time (as compared to what is needed if the positional corrections were not being made), and this causes a wider trench pattern in the top resist 106. To determine the left correction width for the left die 120 in FIG. 8B, the left positional tilt width correction $w_{pos} = t_{top} \times \text{Tan}(\theta')$, where $t_{top}$ is the nominal thickness of the top resist layer, and $\theta' = \alpha + \beta \sim \theta + \beta$ is the total tilt. This means the left positional tilt width correction $w_{pos} = 200$ nm$\times\tan(7.125°) \sim 25$ nm, because $\theta' \sim \theta + \beta = 1.455° + 5.67° = 7.125°$ for the left die. The thickness of the top resist layer 106 is $t_{top} = 200$ nm. The generalized positional tilt in this test case equals $\alpha = 1.444°$, and the total tilt $\theta' = \alpha + \beta = 1.444° + 5.67° = 7.114°$, resulting in a positional tilt width correction $w_{pos} = 200$ nm$\times\text{Tan}(7.114°) \sim 25$ nm. Because using $\theta$ or $\alpha$ results in the same correction of 25 nm (approximately), this validates the chosen approximation of $\alpha \sim \theta$.

To determine the center positional tilt width correction $w_{pos}$ for the center die 120 in FIG. 8D, the center $w_{pos} = t_{top} \times \text{Tan}(\theta') = 200$ nm$\times\text{Tan}(5.67°) \sim 20$ nm, where $\alpha = \theta = 0$ for the center die and $\theta' = \beta$.

As seen in FIGS. 8A and 8B, the trench opening is increased by $w_{pos} = 25$ nm to be 125 nm for the left die, which results in a deposited film 250 of 100 nm in the x'-axis instead of 75 nm in FIG. 7B. Similarly, as seen in FIGS. 8C and 8D, the trench opening is increased by $w_{pos} = 20$ nm to be 120 nm for the center die, which results in a deposited film 250 of 100 nm in the x'-axis instead of 80 nm in FIG. 7D. It is noted that before the correction, FIG. 7B shows the film 250 with a width of 75 nm in the x'-axis when a 100 nm width was originally designed and FIG. 7B shows the deposited film 250 with a width of 80 nm in the x'-axis when a 100 nm width was originally designed. The solutions implemented by the designers have corrected for both the positional tilt $\alpha$ and the stage tilt $\beta$.

A Josephson junction (JJ) produced by the Dolan bridge process with positional tilt corrections is described. Two trenches 108 made into resist are separated by a small resist gap along the y axis such as in FIG. 1. Both trenches are aligned with each other in their long dimensions along the y axis. The resist gap may be 200 nm. The resist gap contains only top resist layer 106 and no bottom resist layer 206, and this resist gap is supported on two opposite sides in the x axis by top resist layer 106 which contains bottom resist layer 206 under it. The resist gap with suspended top resist is known as a Dolan bridge. An evaporation is then performed along the y axis with a tilt about the x axis from z to y in the yz plane. This tilt can be 10° in some implementations. First film 250 will then deposit towards the top trench and under the Dolan bridge. Then, after an oxidation step without breaking vacuum, an evaporation is performed along the y axis with a tilt about the x axis from y to z in the yz plane. This tilt can be 10° in some implementations. Second film 250 will then deposit towards the bottom trench and under the Dolan bridge. The respective thicknesses of the top and bottom resist layers may be designed to allow the oxidized first film 250 to overlap with the second film 250, creating a tunnel junction. If the trenches are in die 120 on the left, with r=1 inch and L=1 m, there will be a positional tilt of 1.455°. If the top resist layer has a thickness $t_{top} = 200$ nm and the bottom resist layer has a thickness $t_{bot} = 300$ nm, the positional tilt will reduce the width of the first and second film 250 by 5 nm, as seen in FIG. 2B. By imposing a positional tilt width correction $w_{pos} = 5$ nm of additional width on the trench widths in left die 120, the area of the overlap will be corrected and will have the same area as that of the overlap achieved in center die 120 (without a correction, since by construction, there is no positional tilt in the center).

2. Sidewall Deposit Corrections

The sidewall deposit correction is to correct a channel (e.g., trench) that contains a sidewall deposit from a previous shadow evaporation in order to result in a desired 100 nm film width for the deposited film 250 in this example. Manhattan junction fabrication by shadow evaporation is a non-limiting example where sidewall deposit correction is important. FIGS. 1 and 4 show perspective views of the source evaporator 150 relative to the wafer 102/stage 104, and these views are not repeated but can be referenced herein.

Test case 2A is depicted in FIGS. 9A and 9B, and the solution is depicted in FIGS. 10A and 10B.

Solution 2A (to test case 2A) is to calculate how much street width (e.g., the width of the trench) was reduced by the expected width of sidewall deposit from previous evaporation(s) that generate the sidewall deposits. The sidewall width correction $w_{side} = \Sigma_i [t_{nom,i} \times \text{Sin}(\theta'_i)]$, where $t_{nom,i}$ is the nominal thickness of previous evaporation of index i which landed on the sidewall, $\theta'_i$ is the total tilt angle relative to the vertical z direction of the evaporation of index i used to create the respective sidewall deposit of index i, and $\Sigma_i$ is the sign for summation over all indices i (in which an evaporation landed on the sidewall). As noted above, the total tilt angle $\theta'$ for a given evaporation includes both a stage tilt angle $\theta$ and a generalized positional tilt $\alpha$ (which may be approximated by the positional tilt $\theta$ for $\beta<20°$ and r<<L) such that $\theta' = \alpha + \beta$. The nominal thickness of an evaporation is a calibrated value which is tracked in real time by a device such as a crystal monitor mounted in the vacuum chamber within an evaporator. It corresponds to the thickness of a given material when deposited onto a flat surface without stage tilt.

For evaporations parallel to the reduced width street (e.g., $2^{nd}$ evaporation for Manhattan junctions), the designers increase the street width by the amount of sidewall width reduction, either by using pattern or dose corrections. This correction can be in addition to applicable tilt (both positional tilt and stage tilt) corrections (test case 1A, 1B, and 1C), but multiple such corrections are additive to first approximation. In particular, the geometry of each sidewall profile and how each deposit attaches to the sidewall must be taken into account in the model used to apply the corrections.

For subsequent evaporations along the same axis as previous evaporations (e.g., $2^{nd}$ evaporation for Dolan bridge junctions), the need for a sidewall correction depends on how the subsequent evaporation affects the overlap area between the two or more films.

For sequential evaporations where there is need for a sidewall correction, the total width correction $w_{tot}$ is the result of the addition of the sidewall width correction $w_{side}$ (resulting from previous evaporations) with other types of correction for the subsequent evaporation, such as the positional tilt width correction $w_{pos}$ (or flashing width correction $w_{flash}$), with minor modifications. For a positional width correction in the subsequent evaporation, the total width correction $w_{tot}=w_{side}+t_{eff}\times\text{Tan}(\theta')$, where $t_{eff}$ is the effective thickness of the top layer (modified by the sidewall deposit(s)), and $\theta'$ is the total tilt angle relative to the vertical z direction. Once there is sidewall deposit interfering with the shadow evaporation, the effective thickness of the top layer is not equal the top resist layer. The effective thickness depends on the angle of the sidewall deposit evaporation(s), height(s), history of sidewall attachment, and direction of the new evaporation.

FIG. 9A depicts a top view of the center die according to embodiments of the present invention. FIG. 9B depicts a cross-sectional view of the center die according to embodiments of the present invention. The positional tilt is $\theta=0$ by construction in the center die, and the stage tilt $\theta$ from a previous evaporation is about the y-axis from x to z in the xz plane. All evaporation material lands on the top resist 106 at this angle with 100 nm opening and sidewall deposit nominal thickness of 40 nm (for example, for a Manhattan crossing). In the top view of FIG. 9A, evaporation material is not shown on the top, so as not to obscure the figure. The parameters are changed from above. In FIGS. 9B and 10B, the thickness of the top resist layer 106 in the z'-axis is 250 nm and the thickness of the bottom resist layer 206 in the z'-axis is 250 nm. In FIG. 9B, a previous shadow evaporation (1$^{st}$ shadow evaporation) resulted in the sidewall deposit 202 with a nominal thickness of 40 nm in the direction of evaporation as defined along the original z-axis. Because of the previous shadow evaporation, the width of the trench opening (i.e., feature 108) is reduced from 100 nm to 80 nm. The nominal thickness of the previous shadow evaporation (1$^{st}$ evaporation) is 40 nm in the evaporation direction (z direction) and performed at a 30° evaporation angle relative to the vertical z direction as shown in FIGS. 9B and 10B. The previous shadow evaporation leaves no film 250 deposited on sample 102 inside trench 108. The previous shadow evaporation leaves film 250 deposited inside trenches 108 that are not shown and are at a right angle with the trenches 108 that are shown. For building a Manhattan junction, the designers must rotate the stage 90° in the xy plane and next evaporate parallel to the trench (i.e., shadow evaporation is along the y-axis), resulting in an overlap of films 250 along trenches 108 that are shown and right angle trenches 108 that are now shown, at the intersections of the two types of trenches. Because there is no positional tilt in the center die, and the next evaporation is performed parallel to the trench 108, there is only a sidewall correction to be applied as a consequence of the sidewall deposit 202 shown in FIGS. 9A and 9B. The designers increase the width of the trench by 20 nm to get 100 nm deposited film 250 (not shown) into the trench in the center in the 2$^{nd}$ evaporation. This can be achieved with design or dose correction as discussed above.

Originally, the trench opening is 100 nm before the 1$^{st}$ shadow evaporation but will result in an 80 nm deposited film after the 1$^{st}$ shadow evaporation in FIG. 9B. To determine the width of the deposited film for the 2$^{nd}$ shadow evaporation, first the designers calculate the width reduction of the trench width measured by the opening of the top resist layer. This reduction is the same as the sidewall width correction $w_{side}=t_{nom}\times\text{Sin}(\theta')$, where $t_{nom}$ is the nominal thickness of the evaporation that landed on the sidewall, and $\theta'$ is the total stage tilt used to create the respective sidewall deposit. Since the generalized positional tilt in the center die is $\alpha=0$, then $\theta'=\alpha+\beta=\beta$, where $\beta$ is the stage tilt used to create the respective sidewall deposit. The designers obtain $w_{side}=t_{nom}\times\text{Sin}(\beta)=40$ nm$\times\text{Sin}(30°)=20$ nm. The width of the deposited film in the subsequent evaporation is then obtained by subtracting $w_{side}$ from the width of the opening, 100 nm, which results in a subsequent deposited film width of 80 nm. Therefore, the 2$^{nd}$ shadow evaporation (subsequent, not shown) along the y-axis results in a deposited film with a width of 80 nm, because the trench opening has been effectively reduced to 80 nm. This reduction in width needs to be corrected for.

The solution is depicted in FIGS. 10A and 10B. FIG. 10A is a top view of the center die according to embodiments of the present invention. FIG. 10B is a cross-sectional view of the center die according to embodiments of the present invention. Accordingly, the trench (feature 108) is corrected to have a trench width of 120 nm in the x'-axis instead of 100 nm (in FIGS. 9A and 9B), and this results in a deposited film (from a subsequent evaporation along the y axis, like layer 250 but not shown) with width 100 nm in FIG. 10B instead of 80 nm which as in FIG. 9B. Using the formula above, the deposited film width in FIG. 10B is determined by subtracting the same sidewall width correction $w_{side}=20$ nm from the width opening, 120 nm, resulting in a deposited film width of 100 nm.

Test case 2B is depicted in FIGS. 11A, 11B, 11C, 11D, 12A, 12B, and 12C. FIG. 11A is a simplified top view of the stage 104 holding the sample 102, without showing the evaporation source 150 although it is understood that the evaporation source is present. FIG. 11B is a top view of the left die of FIG. 11A. If there is positional tilt to any of the evaporations, those must be taken into account. In this example, the left die is 1 inch away left-of-center in the x direction, and this results in a 1.455° positional tilt correction (i.e., positional tilt $\theta 1=1.455°$ of first evaporation) in the absence of a stage tilt. Additionally, when the stage 104 is tilted 30° (stage tilt $\beta 1=30°$ of first evaporation) about the y-axis from the x-axis to the z-axis in the xz plane, the generalized positional tilt $\alpha 1$ of the first evaporation at $\beta 1=30°$ on that die becomes 1.244° (i.e., generalized positional tilt $\alpha 1=1.244°$ of first evaporation). The sidewall width correction $w_{side}=40$ nm$\times\text{Sin}(1.244°+30°)\sim 21$ nm, because the total stage tilt of the first evaporation is $\theta 1'=\alpha 1+\beta 1=1.244°+30°$. As noted herein, the thickness (which is 40 nm in the example scenario) utilized in the calculation is the nominal thickness of the sidewall deposit 202 at the angle of evaporation that created the sidewall deposit 202. Calculating 21 nm for the sidewall width correction $w_{side}$ means that the opening of the trench (feature 108) would need to be 121 nm (which is an additional 21 nm) in order to deposit a film 250 (not shown) with a width of 100 nm for an evaporation directly along the trench (otherwise there will be a new positional tilt as will be described next). For a Manhattan crossing, there will be another trench 108 (not shown) which intersects the trench 108 of FIG. 11B at a right angle (90°, along the x-axis in FIG. 11B). At the intersection of the two trenches 108, there can be an overlay. The evaporation that created the sidewall deposit 202 also deposited a film along the another trench 108 (which is at 90°) that is not shown in FIG. 11B and is at a right angle to the trench 108 shown in FIG. 11B, and there will be an overlap of both films 250 (from first and subsequent evaporations) where both trenches intersect. An oxidation step can be performed without breaking vacuum prior to deposition along the trench 108 which is shown in FIG. 11B. This will create an overlay between the first film 250 from the first evaporation (not shown), and the subsequent film 250 from the subsequent evaporation.

FIG. 11C is a simplified top view of the stage 104 in FIG. 11A with a 90° rotation of the stage 104 about the z-axis from y to x in the xy plane. FIG. 11D is a top view of the top die shown in FIG. 11C. After the 90° rotation of the stage 104 about the z-axis from y to x in the xy plane, the left die of FIG. 11A becomes the top die of FIG. 11C.

Figure 12C:
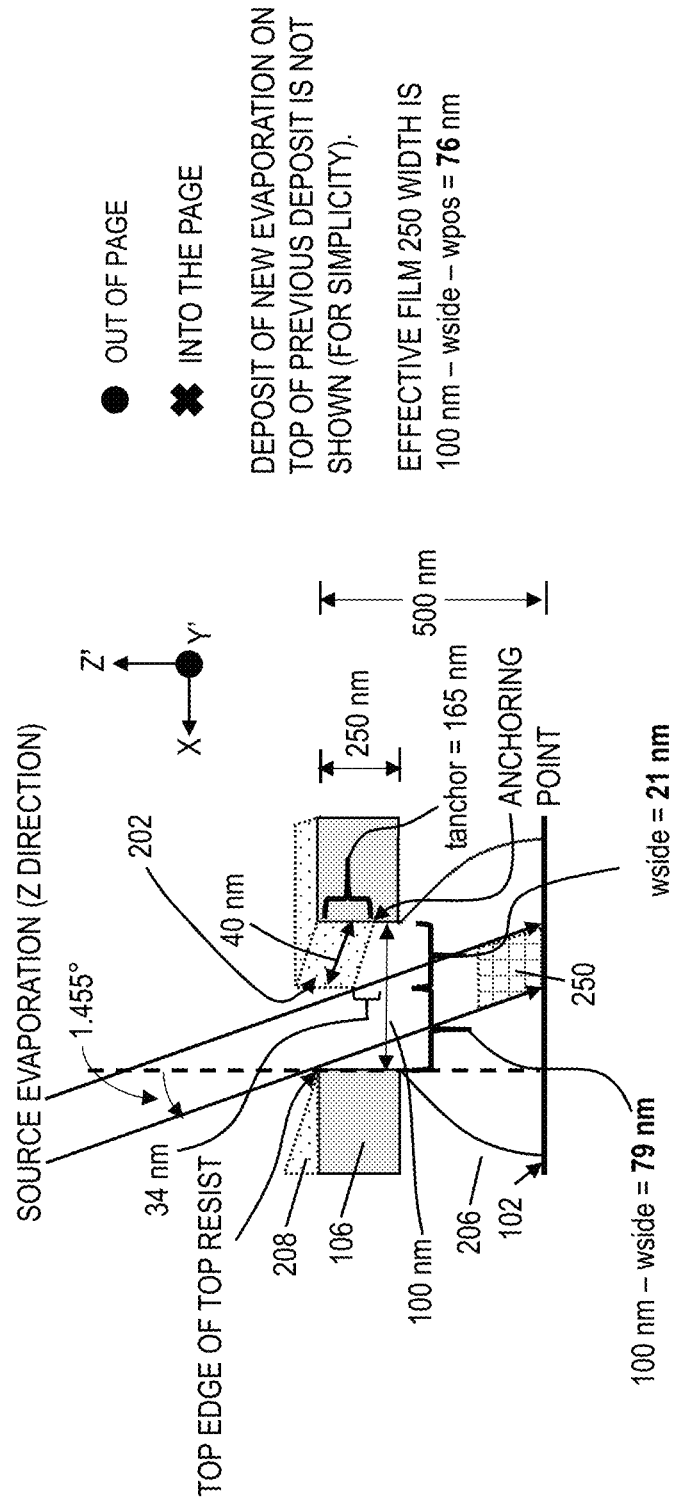
FIG. 12C is a cross-sectional view of the rotated left die in FIG. 12B according to embodiments of the present invention.

FIG. 12A is a simplified top view of the stage 104 holding the wafer 102 as in FIG. 11C. FIG. 12B is a top view of the rotated and tilted left die of FIG. 11A, as shown by the tilted axes (y' and z'). FIG. 12C is a cross-sectional view of the rotated and tilted left die of FIG. 11A. In FIGS. 12A and 12B, a subsequent evaporation is performed with a subsequent stage tilt of β2=35° about the x-axis from the y-axis to the z-axis in the yz plane, resulting in the axes y' and z' after the stage tilt, as shown in FIG. 12B. The subsequent stage tilt of 35° for the subsequent evaporation has no effect on the generalized positional tilt because it is performed along the trench 108 of FIG. 12B. An overlay is created with the first film deposited during the first evaporation into the another trench 108 which intersects the trench 108 of FIG. 12B at a right angle (the another trench 108 is not shown). This overlay is a Manhattan crossing, the overlay area of which will require both a sidewall correction and a positional tilt correction. Because the positional tilt for an evaporation along the trench 108 is not affected by the stage tilt angle about the x-axis, the generalized positional tilt for the subsequent evaporation α2 is equal to the positional tilt of the subsequent evaporation θ2=1.455° for r=1" and L=1 m. The total tilt of the subsequent shadow evaporation becomes θ2'=θ2=1.455°. For a top resist thickness (for top resist layer 106) $t_{top}$=250 nm, the positional tilt correction from the resist alone would naively be $t_{top}$×Tan(θ2')=250 nm×Tan(1.455°)~6 nm, but this turns out to be incorrect because the opening of the trench is reduced from $t_{top}$ to a value $t_{eff}$ as a result of the sidewall deposit 202. Instead, one has to consider the deposit profile as further depicted in FIGS. 12A, 12B, and 12C.

The effective opening of the trench (feature 108) at the top $t_{eff}$ for an evaporation of a film 250 landing on the sample 102 in the space under the sidewall deposit 202 (as in FIG. 12C) depends on the lower edge (i.e., anchoring point) of the previous sidewall deposit 202 on the right and the top edge of the top resist layer 106 on the left. Utilizing geometry, the lower anchoring point of the sidewall deposit 202 is related to the distance from the top resist layer top edge on the left by $w_{trench}$=$t_{anchor}$×Tan(θ1'), where $w_{trench}$ is the horizontal distance between anchoring point on the right and the opposite top resist layer side, $t_{anchor}$ is the vertical distance between the anchoring point of the sidewall and the top resist layer top edge on the left, and θ1' is the total tilt of the evaporation that created the sidewall deposit (first evaporation). In FIG. 12C, there is only one sidewall deposit, so that $w_{trench}$=w=opening of the trench=100 nm (it may differ from the opening of the trench if there are multiple sidewall deposits). Since θ1'=31.244° in the first evaporation (taking into account the positional tilt of the first evaporation), this results in $t_{anchor}$=$w_{trench}$ Tan(θ1')=100 nm/Tan(31.244°) ~165 nm below the top resist layer top edge on the right. The lower edge of the previous sidewall deposit 202 is at a height=$t_{nom}$×Cos(θ1')=40 nm×)Cos(31.244°)~34 nm above the anchoring point. The projection of the subsequent evaporated film through the resist opening, taking into account the sidewall deposit, is determined by the height difference $t_{eff}$ between the top edge of the top resist layer on the left and the lower edge of the previous sidewall deposit on the right. Therefore, $t_{eff}$=165 nm-34 nm=131 nm. Finally, the sidewall-corrected positional tilt correction of the opening of w=100 nm is $w_{pos}$=$t_{eff}$×Tan(θ2')=131 nm×Tan(1.455°)~3 nm, where the total tilt of the subsequent evaporation is θ2'=θ2=1.455°. The total correction equals the sidewall correction plus the sidewall-corrected positional tilt correction, given by $w_{tot}$=$w_{side}$+$w_{pos}$=21 nm+3 nm=24 nm. This means that the trench opening (feature 108) should be 124 nm to result in a 100 nm width film of the deposited film 250 in the subsequent evaporation (without correction, the effective width of the deposited subsequent film 250 is 100 nm−$w_{side}$−$w_{pos}$=100 nm−24 nm=76 nm). The widening of the trench in the left die of FIG. 11B (which was rotated by 90° after the first evaporation about the z-axis from y to x in the xy plane) for the purpose of correcting the width of the deposited film can be accomplished with pattern design or dose as discussed above.

Test case 2C is depicted in FIGS. 13A, 13B, 13C, 13D, 14A, 14B, and 14C. FIG. 13A is a simplified top view of the stage 104 holding the wafer 102, without showing the evaporation source 150 although it is understood that the evaporation source is present. FIG. 13B is a top view of the right die of FIG. 13A. In this example, the right die is 1 inch away right-of-center in the x direction, and this results in a 1.455° positional tilt correction (i.e., positional tilt θ1=1.455° of first evaporation) in the absence of a stage tilt. Additionally, when the stage 104 is tilted 30° (stage tilt β1=30° of first evaporation) about the y-axis from the x-axis to the z-axis in the xz plane, the generalized positional tilt α1 of the first evaporation at β1=30° on that die becomes 1.276° (i.e., generalized positional tilt α1=1.276° of first evaporation). The sidewall width correction $w_{side}$=40 nm×Sin(−1.276°+30°)~19 nm, because the total stage tilt of the first evaporation is θ1'=−α1+β1=−1.276°+30°=28.724°. The generalized positional tilt is subtracted from the stage tilt because it is right-of-center relative to the stage in the same manner as in FIG. 6. As noted herein, the thickness (which is 40 nm in the example scenario) utilized in the calculation is the nominal thickness of the sidewall deposit 202 at the angle of evaporation that created the sidewall deposit 202. Calculating 19 nm for the sidewall width correction $w_{side}$ means that the opening of the trench (feature 108) would need to be 119 nm (which is an additional 19 nm) in order to deposit a film 250 (not shown) with a width of 100 nm for an evaporation directly along the trench (otherwise there will be a new positional tilt as will be described next). FIG. 13C is a simplified top view of the stage 104 in FIG. 13A with a 90° rotation of the stage 104 about the z-axis from y to x in the xy plane FIG. 13D is a top view of the bottom die shown in FIG. 13C. After the 90° rotation of the stage 104 about the z-axis from y to x in the xy plane, the right die of FIG. 13A becomes the bottom die of FIG. 13C.

Figure 14C:
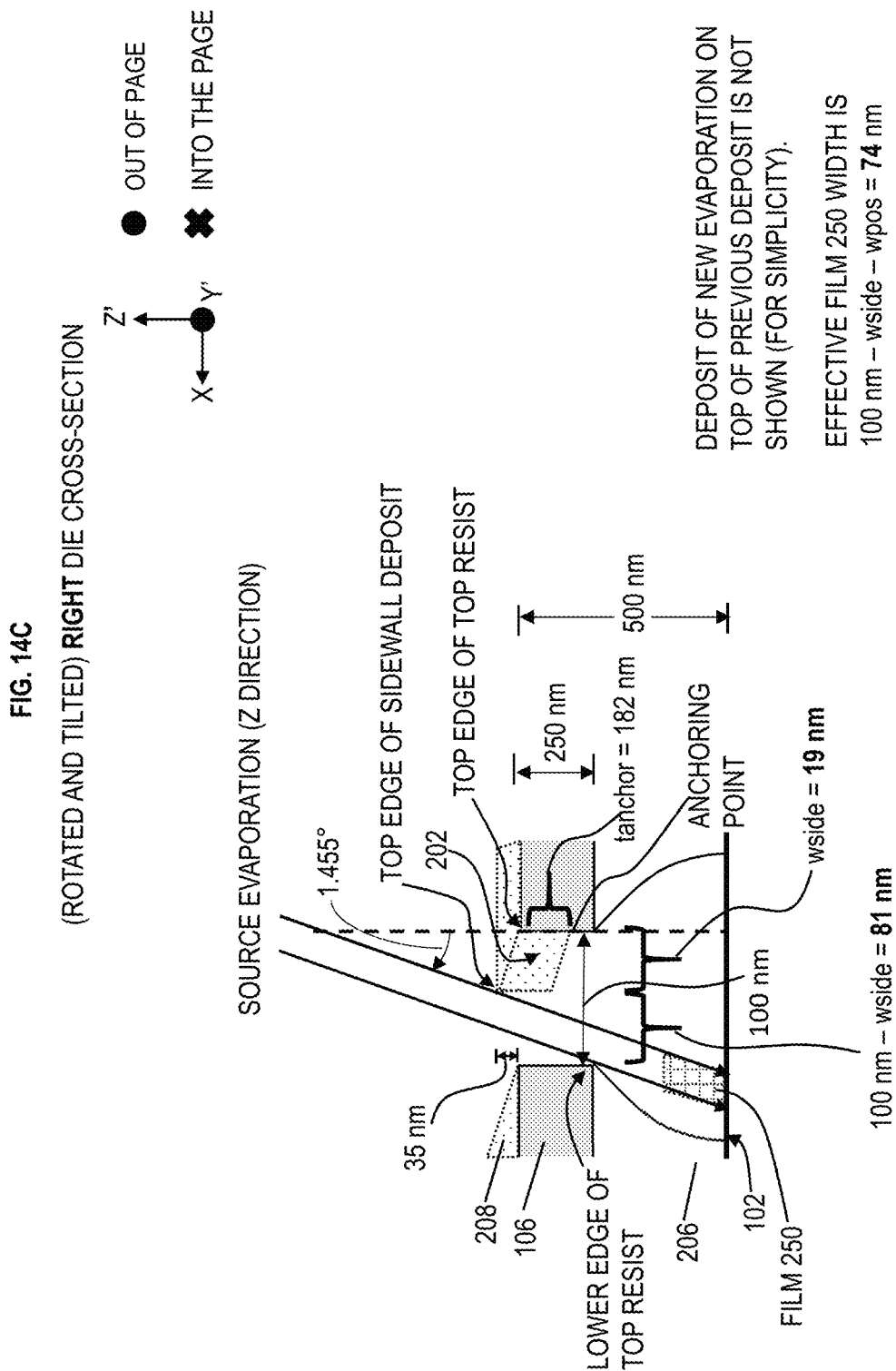
FIG. 14C is a cross-sectional view of the rotated left die in FIG. 14B according to embodiments of the present invention.

Further regarding the test case 2C, FIG. 14A is a simplified top view of the stage 104 holding the wafer 102 as in FIG. 13C. FIG. 14B is a top view of the rotated and tilted right die of FIG. 13A, as shown by the tilted axes (y' and z'). FIG. 14C is a cross-sectional view of the rotated and tilted right die of FIG. 13A. In FIGS. 14A and 14B, a subsequent evaporation is performed with a subsequent stage tilt of β2=35° about the x-axis from the y-axis to the z-axis in the yz plane, resulting in the axes y' and z' after the stage tilt, as shown in FIG. 14B. The subsequent stage tilt of 35° for the subsequent evaporation has no effect on the generalized positional tilt because the evaporation is performed along the trench 108 of FIG. 14B. An overlay is created with the first film deposited during the first evaporation into the another trench 108 which intersects the trench 108 of FIG. 12B at a right angle (the another trench 108 is not shown). This overlay is a Manhattan crossing, the overlay area of which will require both a sidewall correction and a positional tilt correction. Because the positional tilt for an evaporation along the trench 108 is not affected by the stage tilt angle about the x-axis, the generalized positional tilt for the subsequent evaporation α2 is equal to the positional tilt of the subsequent evaporation θ2=1.455° for r=1" and L=1 m. The total tilt of the subsequent shadow evaporation becomes θ2'=θ2=1.455°. The difference between cases 2B and 2C relies on the position of the die relative to the center only, while all stage tilts, rotation angles, and evaporated thicknesses remain the same.

Next, the cross-section will be considered again to calculate the total correction. The effective opening of the trench (feature 108) at the top $t_{eff}$ for an evaporation of a film 250 landing on the sample 102 in the space that is not under the sidewall deposit 202 (as in FIG. 14C, and unlike FIG. 12C) now depends on the top edge of the previous sidewall deposit 202 on the right and the bottom edge of the top resist layer 106 on the left. Utilizing geometry, the top edge of the previous sidewall deposit is at a height given by $t_{nom} \times Cos (\theta1')$=40 nm×Cos(28.724°)~35 nm above the top edge of the top resist. The projection of the subsequent evaporated film through the resist opening, taking into account the sidewall deposit, is determined by the height difference $t_{eff}$ between the top edge of the previous sidewall deposit 202 on the right and the bottom edge of the top resist layer 106 on the left. Therefore, $t_{eff}$=250 nm+35 nm=285 nm. Finally, the sidewall-corrected positional tilt correction of the opening of w=100 nm is $w_{pos}=t_{eff} \times Tan(\theta2')$=285 nm×Tan(1.455°)~7 nm, where the total tilt of the subsequent evaporation is θ2'=θ2=1.455°. The total correction equals the sidewall correction plus the sidewall-corrected positional tilt correction, given by $w_{tot}=w_{side}+w_{pos}$=19 nm+7 nm=26 nm. This means that the trench opening (feature 108) should be 126 nm to result in a 100 nm width film of the deposited film 250 in the subsequent evaporation (without correction, the effective width of the deposited subsequent film 250 is 100 nm−$w_{side}$−$w_{pos}$=100 nm−26 nm=74 nm). The widening of the trench in the left die of FIG. 13B (which was rotated by 90° after the first evaporation about the z-axis from y to x in the xy plane) for the purpose of correcting the width of the deposited film can be accomplished with pattern design or dose as discussed above.

3. Sidewall Flashing Corrections

Figure 15:
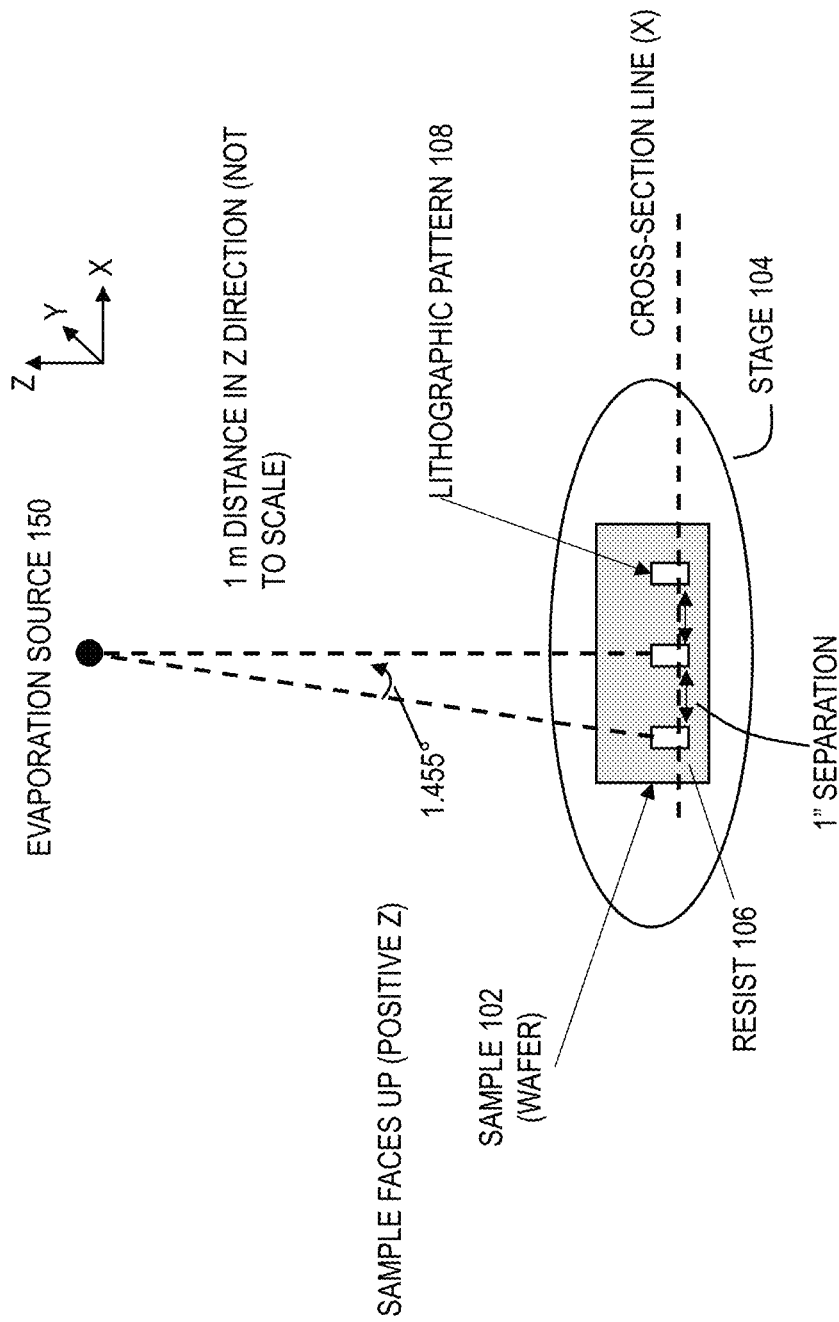
FIG. 15 depicts a perspective view of the stage and evaporation source according to embodiments of the present invention.

Test case 3 is depicted in FIGS. 15, 16A, and 16B. FIG. 15 depicts a view of the stage 104 and evaporation source 150 as discussed herein. FIG. 16A depicts a top view of the left die 120. FIG. 16B depicts a cross-sectional view of the left die in FIG. 16A. An evaporation is projected far enough to the side (due to small resist undercut, high tilt, and/or both) that the deposited film 250 partly (and unintentionally) ends upon the undercut sidewall of the bottom resist 206 instead of the substrate 102, which (further) reduces the width of the evaporated feature (i.e., film 250) on the substrate 102.

First Solution 3 is undercut engineering. Undercut engineering is configured to add/extend sublithographic shapes or partial dose features next to the channel (i.e., trench opening) in order to increase the width of the undercut. The undercut is the curved sidewall of the bottom resist layer 206, which is cut/removed under the top resist layer 106. If the undercut (of bottom resist layer 206) increases sufficiently, the deposited features (i.e., film 250) no longer end up on the undercut sidewall. This can be done quantitatively for specific features and locations, but the undercut can also be increased preventively without quantitative analysis. There is a practical limit to the extent of increasing the undercut.

Second Solution 3 is the following. The reduced feature width (film 250) due to sidewall flashing can also be corrected by increasing the channel width (i.e., the opening of the trench feature 108) by the correction amount $w_{flash}$. A predictive calculation requires detailed quantitative knowledge of the resist profile, particularly the resist thicknesses and the amount of undercut. Additionally, the needed correction can also be determined empirically. The channel width increase can be achieved by pattern or dose correction.

Referring to FIG. 16B, the deposited film 250 abuts and lands (i.e., flashes) on the curved sidewall of the bottom resist layer 206. Flashing on the curved sidewall reduces the width of the film 250 in the x'-axis (axes are assumed to be tilted by some arbitrary value, in accordance to previous configurations of the correction to be performed). To address this flashing, FIG. 17A depicts a top view of the left die, and FIG. 17B depicts a cross-sectional view of FIG. 17A. In FIG. 17B, the left side of the undercut of resist 206 is increased, which prevents the film 250 from landing on the curved sidewall of the bottom resist 206 and allows the entire film 250 to be deposited on the substrate 102. This is the first solution 3.

Alternatively (and/or additionally), to address this flashing, FIG. 18A depicts a top view of the left die, and FIG. 18B depicts a cross-sectional view of FIG. 18A. In FIG. 18B, the width of the trench feature 108 is increased to compensate for the sidewall deposit 202. The deposited film 250 can still hit or land on the curved sidewall of the bottom resist 206, but the film 250 has the correct width in the x'-axis because of the increased trench width (opening) in the x'-axis.

FIG. 19 depicts a cross-sectional view as examples of 3 completed Josephson junctions 1902 using the one or a combination of any of the shadow evaporation corrections discussed herein according to embodiments of the present invention. As discussed herein, there are 3 lithographic features 108 formed in the top resist layer 106 and bottom resist layer 206, which results in 3 dies 120. In order to fabricate the 3 Josephson junctions 1902, 2 shadow evaporations are required. The first shadow evaporation deposits the first film 250 on the substrate 102. Corrections, such as positional tilt corrections and/or sidewall flashing corrections, have been applied to the first shadow evaporation. There is no need for sidewall corrections to be applied to the first shadow evaporation from the evaporation source 150 because no sidewall deposit 202 has occurred prior to the first shadow evaporation.

After the first shadow evaporation to deposit the first film 250, an oxide layer 1904 is grown on top of first film 250. For example, the superconducting metal of the first film 250 can be oxidized to form the oxide layer 1904. The oxide is typically grown by oxidizing the existing superconductor metal, such as Aluminum, without breaking vacuum. This is done by introducing oxygen gas into the evaporation chamber or an attached oxidation chamber that the sample can be transferred to and from without vacuum break at this step. Alternatively, an oxide can be deposited instead of grown.

Previously, in the various examples, shadow evaporation was discussed to deposit a film only on the substrate 102 for explanation purposes. It is understood to form a Josephson junction that the second film is deposited on the previously deposited film (particularly on the oxide layer), thereby resulting in a Josephson junction. In FIG. 19, a second shadow evaporation from the evaporation source 150 is performed to deposit the second film 250 on top of the oxide layer 1904. The second shadow evaporation has been corrected for corrections, such as positional tilt corrections, sidewall flashing corrections, and/or sidewall deposit corrections. It is noted that sidewall deposit corrections are accounted for only after a previous shadow mask evaporation has occurred (e.g., the first shadow mask evaporation).

After the Josephson junctions 1902 have been formed, the bottom resist layer 206, top resist layer 106, and any deposited material from shadow evaporations (such as the sidewall deposit 202 and top deposit 208) formed on the top resist layer 106 are removed. This leaves the 3 Josephson junctions 1902 on the substrate 102.

FIG. 20 depicts example systems configured to perform the corrections discussed herein according to embodiments of the present invention. A computer system 2000 includes a software tool 2002 configured with one or more algorithms to perform positional tilt corrections, sidewall deposit corrections, and/or sidewall flashing corrections for design features 108 in an original layout 2004, in order to generate a corrected layout 2006. The software tool 2002 can include the functionality to allow for layout 2004 of a design that is to be fabricated and/or can receive loading of the original layout 2004 in order to perform the corrections discussed herein. The computer system 2000 includes one or more processors 2010 configured to execute instructions of the software tool 2002, thereby generating the corrected layout 2006 from the original layout 2004.

The computer system 2000 can transmit the corrected layout 2006 to a lithographic tool 2020. In some implementations, the lithographic tool 2020 can include the software tool 2002 and/or functionality of the software tool 2002 such that the lithographic tool 2020 is configured to make the corrections to the original layout 2004 to generate the corrected layout 2004.

Figure 27B:
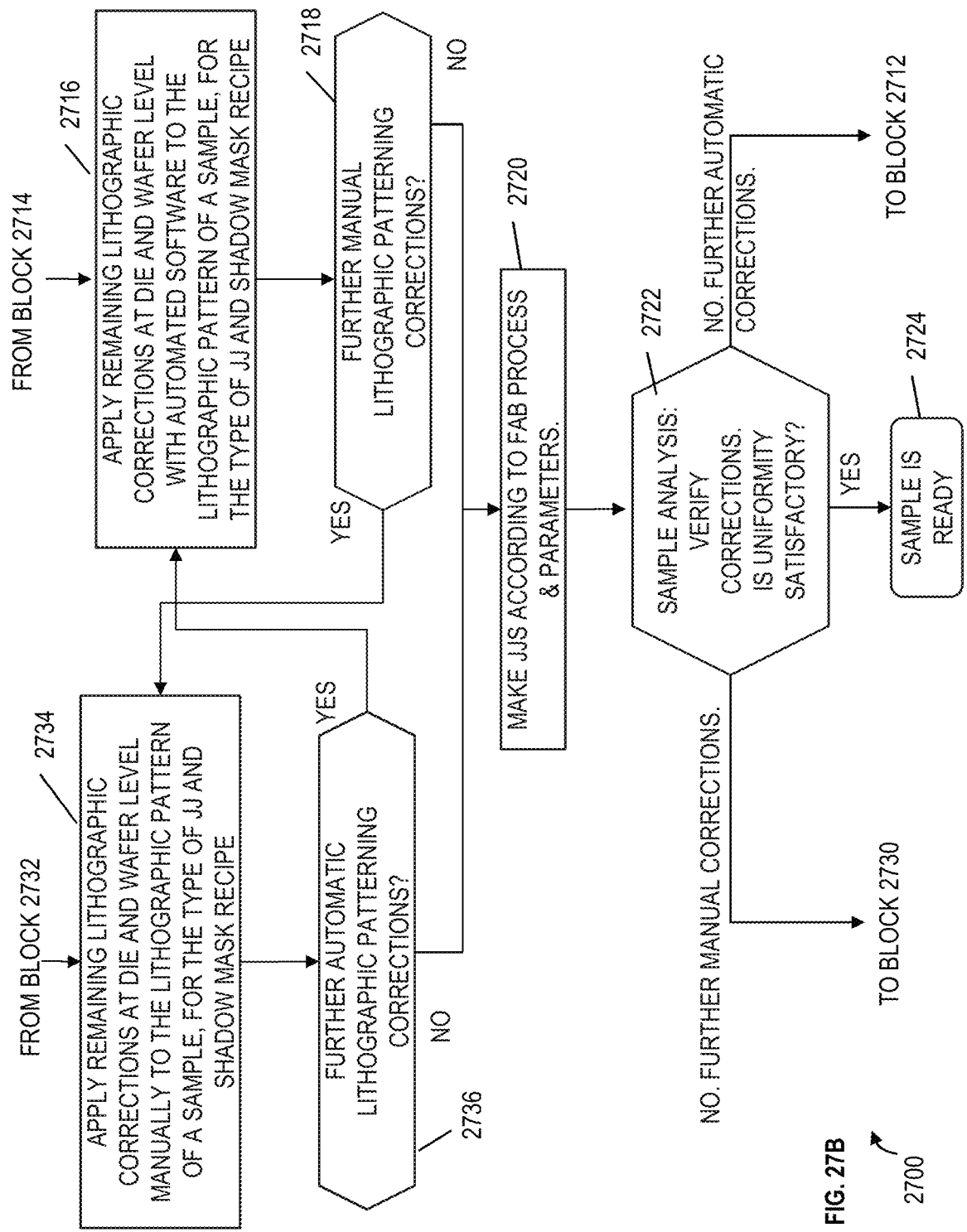
FIG. 27B continues the flow chart of FIG. 27A according to embodiments of the present invention.

The lithographic tool 2020 includes fabrication equipment 2022 for fabricating semiconductor circuits (including superconducting circuits) as understood by one skilled in the art. The fabrication equipment 2022 can represent a variety of fabrication devices which can be separate or integrated in a fabrication lab. The lithographic tool 2020 includes the circuitry 2024 (hardware along with software) to operate as discussed herein. The lithographic tool 2020 alone and/or in conjunction with the computer system 2000 is configured to perform a process in FIGS. 27A and 27B. FIGS. 27A and 27B depict a flow chart 2700 of a process for correcting and forming Josephson junctions for superconducting qubits when depositing the films 250 of the Josephson junction using sequential shadow mask evaporations. At block 2702, the software tool 2002 receives the choice of critical current $I_C$ values for Josephson junctions in superconducting qubits to be fabricated. At block 2704, the software tool 2002 receives selection of the Josephson junction design/style (e.g., Dolan bridge Josephson junctions, Manhattan Josephson junctions, other shadow-masked Josephson junctions).

At block 2706, the software tool 2002 receives selection of the fabrication process and parameters (e.g., tilt angles for shadow evaporations, oxidation conditions). Further, the design/style for Dolan bridge Josephson junctions and Manhattan Josephson junctions have fabrication process and parameters for height/thickness/multilayer/undercuts, bridge dimensions, tilt angles, rotation angles, film thicknesses, sample size, etc., as understood by one skilled in the art.

At block 2708, the software tool 2002 (which can include the features of a state-of-the-art layout tool) designs the Josephson junctions that nominally confirm with the style and fabrication parameters, thereby creating the original layout 2004. The originally layout 2004 is a file (i.e., computer file). In some embodiments, original layout 2004 can be created by a state-of-the-art software program, and then loaded to the computer system 2000 for corrections. At block 2710, the corrections discussed herein can be manual or automatic corrections. At block 2712, the software tool 2002 is configured to apply software automated corrections at wafer and die level to the original layout (design) 2004 for the type of Josephson junctions and shadow mask recipe. This creates the corrected layout (design) 2006. Although two layouts are illustrated as the original layout 2004 and the corrected layout 2006 for explanation purposes, the corrections can be made to the original layout 2004 such that original layout 2004 itself is now corrected/updated (i.e., after the corrections the original layout becomes the corrected layout). Corrected layout 2006 can be a separate layout in one implementation, and the corrected layout 2006 can be an updated version of the original layout 2004.

A layout is a representation of a design, and often used interchangeably. At the design/layout correction stage, the software (or manual) correction will take each of the features 108 in the design and adjust these features 108 to achieve the desired effect (i.e., positional tilt correction, sidewall deposit correction, sidewall flashing correction) either at the individual die level (die is a unit of repetition of a mask design on a wafer), or wafer level (that is, corrects features on separate dies differently). The layout becomes a file that can be used for lithography.

Optionally, at block 2714, the software tool 2002 is configured to check if there are any further design corrections that the operator desires to manually make. For example, the software tool 2002 is configured to display a message asking the operator if he wants to make further manual corrections addressing positional tilt correction, sidewall deposit correction, and/or sidewall flashing correction.

If no manual corrections are needed to the corrected layout 2006, the software tool 2002 is configured to apply any remaining lithographic corrections at the die and wafer level with automated software to the lithographic pattern of a sample, for the type of Josephson junctions and shadow mask recipe at block 2716. With respect to the patterning stage, the mask design (i.e., corrected layout file 2006) of the previous block is entered as input to a lithographic tool 2020 such as an e-beam writer (which is a type of fabrication equipment). An e-beam writer or a direct write laser lithography system can be particularly utilized for embodiments of the present invention because of the feature size and versatility afforded. The fabrication equipment 2022 can also be representative of optical lithography equipment in which an optical mask is a physical object that is fixed in shape and used to pattern the features with light of a fixed wavelength (corresponding to a location in the optical spectrum, e.g., ultraviolet, visible, infrared). The operator and or software tool 2002 can additionally provide a job file as input to the lithographic tool 2020, which manages how to handle the design input which is the corrected layout 2006.

Additionally, the lithographic tool 2020 (for an e-beam writer, for example) can provide a mechanism (such as software tool 2002) to receive a mask design (original layout 2004) and modify it (to be the corrected layout 2006) for the purpose of area correction in the multiple-shadow-mask fabrication. In other words, given an input design (original layout 2004), the software tool 2002 integrated in the lithographic tool 2020 would post-process the original layout to correct it for that type of fabrication (i.e., e-beam), and the exposures of the pattern on the wafer (or sample) would come out corrected.

At block 2718, the software can check (e.g., display a message) whether the operator wants to any manual lithographic patterning corrections. At block 2720, the lithographic tool 2020 makes the Josephson junctions according to the fabrication process and parameters. Fabricating the Josephson junctions can include depositing the resists 106, 206 on the wafer 102, exposing the resists 106, 206, etching substrate 102, developing the resists 106, 206, performing shadow mask evaporation (i.e., depositing first and second films 250) and oxidation or oxide deposition (for oxide layer 1904) according to the planned shadow mask recipe (i.e., design), and performing lift off of the resists 106, 206 leaving Josephson junctions 1902.

At block 2722, a sample analysis can be performed to verify that the corrections occurred as desired. If yes, the sample is ready, the flow branches to block 2724.

Taking the other branch from block 2710, the operator can apply manual corrections at wafer and die level to the original layout (design) 2004 for the type of Josephson junctions and shadow mask recipe. This creates the corrected layout (design) 2006. The operator could use the software tool 2002.

At block 2732, the operator can check if there are further automatic design corrections. If no automatic design corrections needed, the operator can apply any remaining lithographic corrections at the die and wafer level without automated software to the lithographic pattern of a sample, for the type of Josephson junctions and shadow mask recipe at block 2734. The operator can use the software tool 2002.

At block 2736, the operator can check if further automatic lithographic patterning corrections are needed. If yes the flow branches to 2716, and if no the flow branches to block 2720.

As further information on the hardware side (as would be understood by one skilled in the art), a wafer/sample 102 would have resist (spun over it) which is sensitive to the patterning tool exposure method (via the lithographic tool 2020). If e-beam is utilized as the fabrication method, the beam is deflected according to the specifications of the mask design and job file (and dose (for e-beam lithography, the dose may be defined as the electric charge per unit area) over areas of the wafer 102 to sensitize the e-beam resist (for example, PMMA or equivalent). If optical lithography is utilized as the fabrication method, light of a fixed wavelength shines into the apertures of a physical optical mask, and where the mask is transparent, the resist is sensitized (photoresist). Because optical lithography uses a physical mask, it is not possible to make local dose modifications within a single die (for optical lithography, the dose may be defined as the intensity times the exposure time). A die is typically the result of a single exposure through the physical optical mask. But it is possible to modify the dose applied to different dies within the wafer using optical lithography.

Further, it is noted that after the resist is sensitized, it can be developed using the appropriate developers. If using a positive tone process, the resist is removed where it is sensitized. In the example scenario, embodiments of the present invention have a bilayer of resist (top resist 106 and bottom resist 206), where an underlayer (bottom resist 206) is used to provide an undercut, as seen in some of the figures (this is a positive tone process).

The fabrication involves making Josephson Junctions 1902 of a given area (given by the overlap of two evaporations) using shadow-masking, not breaking vacuum, and schemes such as Dolans or Manhattans (or other structures). Other methods of fabricating Josephson junctions (or other tunnel junctions) where a point evaporation source is involved may also correct for overlap area using the corrections described here. For example, the fabrication of the Josephson junction may result in less variability across a wafer by applying positional or flashing corrections (sidewall corrections can only be applied if there are multiple evaporations prior to stripping the resist (i.e., prior to lift off)).

In any case, the most corrections will occur at the mask design stage, and the automated software tool 2002 can make the corrections such that the user does not have to make those calculations.

Figure 21:
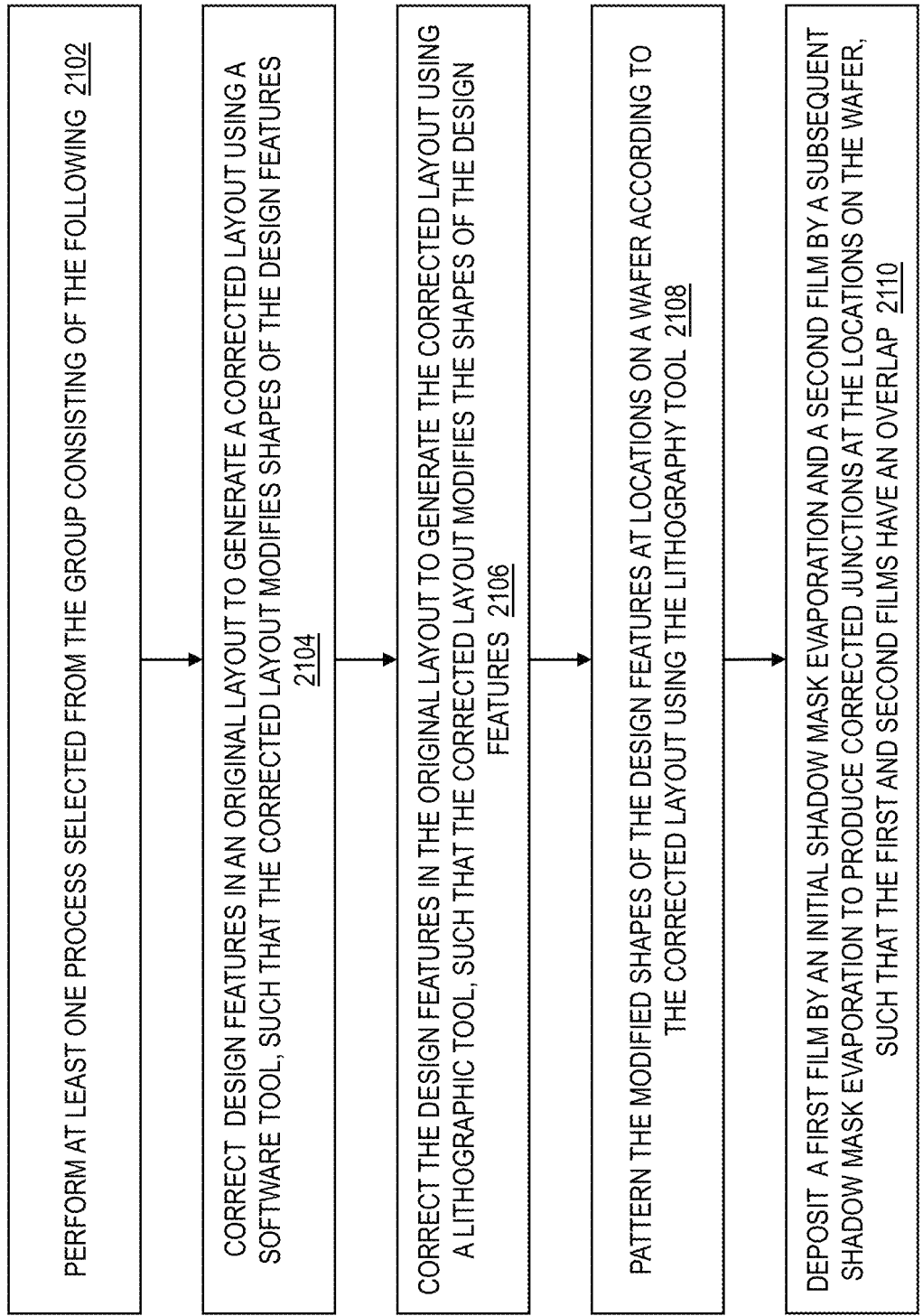
FIG. 21 depicts a flow chart of a method for correcting an area of overlap between two films created by sequential shadow mask evaporations according to embodiments of the present invention.

Turning to FIG. 21, a flow chart 2100 is provided of a method for correcting an area of overlap between two films created by sequential shadow mask evaporations according to embodiments of the present invention. Reference can be made to the figures discussed herein.

At block 2102, an operator (and/or the software tool 2002 is configured to) performs at least one process selected from the group consisting of: correcting design features 108 in an original layout 2004 to generate a corrected layout 2006 using a software tool 2002, such that the corrected layout 2006 has modified shapes of the design features 108 at block 2104, and/or correcting the design features 108 in the original layout 2004 to generate the corrected layout 2006 using a lithographic tool 2020, such that the corrected layout 2006 has modified shapes of the design features 108 at block 2106.

At block 2108, the lithography tool 2020 (which can be instructed by the software tool 2002 and/or operator) is configured to pattern the modified shapes of the design features 108 at locations on a wafer 102 according to the corrected layout 2006.

At block 2110, the lithography tool 2020 is configured to deposit a first film 250 by an initial shadow mask evaporation (as depicted in FIG. 26A) and a second film 250 (as depicted in FIG. 26C) by a subsequent shadow mask evaporation to produce corrected junctions (e.g., junction 1902) at the locations on the wafer 102, such that the first and second films 250 have an overlap (as depicted in FIG. 19).

The overlap between the first and second films 250 defines a tunnel junction. The overlap between the first and second films 250 defines a Josephson junction (JJ). The initial and subsequent shadow mask evaporations may utilize a suspended resist bridge. The suspended resist bridge can be formed by the bilayer resist of resist layers 106 and 206. The initial and subsequent shadow mask evaporations may utilize a crossing without a suspended resist bridge. The crossing relates to a Manhattan crossing. Corrections (such as positional tilt correction, sidewall deposit correction, and/or sidewall flashing correction) to the original layout 2004 account for (accommodate) narrowing of the design features 108 (e.g., the trench in example scenarios) from previous depositions (by shadow mask evaporation) prior to the subsequent shadow mask evaporation.

An oxide layer 1904 is between the first film 250 and the second film 250.

The corrected layout 2006 includes a positional tilt correction. The positional tilt correction is configured to modify the shapes (i.e., trench) of the design features 108 relative to a position of an evaporation source 150 and individual ones of the design features 108.

The corrected layout 2006 includes a sidewall deposit correction. The sidewall deposit correction is configured to modify the shapes (e.g., trenches) of the design features 108 relative to a previous sidewall deposit 202 from a previous shadow mask evaporation.

The corrected layout 2006 includes a sidewall flashing correction. The sidewall flashing correction is configured to modify the shapes of the design features 108 to prevent a width of the first film 250, the second film 250, or both the first and second films 250 from being reduced by flashing against a sidewall of a resist material (e.g., the bottom resist layer 206).

Corrections in the corrected layout include at least two types of corrections selected from the group consisting of: a positional tilt correction, a sidewall deposit correction, and/or a sidewall flashing correction.

Figure 22:
FIG. 22 depicts a flow chart of a method of forming junctions according to embodiments of the present invention.

FIG. 22 depicts a flow chart 2200 of a method of forming junctions according to embodiments of the present invention. Reference can be made to the figures discussed herein.

At block 2202, the operator can utilize the software tool 2002 and/or the lithographic tool 2020 to correct the design features 108 in an original layout 2004 to generate a corrected layout 2006. At block 2204, the operator can utilize the lithographic tool 2020 to pattern the design features 108 of the corrected layout 2006 at locations on a wafer 102. At block 2206, the lithographic tool 2020 is configured to deposit a first film 250 (as depicted in FIG. 26A) and a second film 250 (as depicted in FIG. 26C) using shadow mask evaporation according to the corrected layout 2006, where the corrected layout 2006 corrects for deposition by the shadow mask evaporation.

An overlap between the first and second films 250 defines a tunnel junction. An overlap between the first and second films 250 defines a Josephson junction.

Correcting the design features in the original layout to generate the corrected layout comprises widening shapes (i.e., widening the trench) of the design features 108 relative (i.e., with respect to angles of evaporation) to an evaporation source.

The oxide layer 1904 is between the first film and the second film. The corrected layout includes a positional tilt correction. The corrected layout includes a sidewall deposit correction. The corrected layout includes a sidewall flashing correction.

FIG. 23 depicts a flow chart 2300 for correcting an area of overlap between two films created by sequential shadow mask evaporations according to embodiments of the present invention. Reference can be made to the figures discussed herein.

At block 2302, software tool 2002 and/or the lithographic tool 2020 is configured to correct design features 108 in an original layout 2004 to generate a corrected layout 2006, where the design features 108 in the corrected layout 2006 have been modified to account in advance for being at different positions relative to an evaporation source 150.

At block 2304, the lithographic tool 2020 (software tool 2002 can instruct the lithographic tool 2020) is configured to pattern the design features 108 of the corrected layout 2006 at locations on a wafer 102.

At block 2306, the lithographic tool 2020 (software tool 2002 can instruct the lithographic tool 2020) is configured to deposit a first film 250 (as depicted in FIG. 26A) and a second film 250 (as depicted in FIG. 26C) using shadow mask evaporation according to the corrected layout 2006.

FIG. 24 depicts a flow chart 2400 for correcting an area of overlap between two films created by sequential shadow mask evaporations according to embodiments of the present invention. Reference can be made to the figures discussed herein.

At block 2402, the software tool 2002 and/or the lithographic tool 2020 is configured to correct design features 108 in an original layout 2004 to generate a corrected layout 2006, where the design features 108 in the corrected layout 2006 have been modified to account in advance for sidewall deposits of material (e.g., sidewall deposit 202) on the design features 108 from an evaporation source 150.

At block 2404, the lithographic tool 2020 (software tool 2002 can instruct the lithographic tool 2020) is configured to pattern the design features 108 of the corrected layout 2006 at locations on a wafer 102.

At block 2406, the lithographic tool 2020 (software tool 2002 can instruct the lithographic tool 2020) is configured to deposit a first film 250 (as depicted in FIG. 26A) and a second film 250 (as depicted in FIG. 26C) using shadow mask evaporation according to the corrected layout 2006.

FIG. 25 depicts a flow chart 2500 for correcting an area of overlap between two films created by sequential shadow mask evaporations according to embodiments of the present invention. Reference can be made to the figures discussed herein.

At block 2502, the software tool 2002 and/or the lithographic tool 2020 is configured to correct design features 108 in an original layout 2004 to generate a corrected layout 2006, where the design features 108 in the corrected layout 2006 have been modified to account in advance for flashing against a sidewall of a resist (e.g., bottom resist layer 206 having the curved undercut) during a shadow mask evaporation.

At block 2504, the lithographic tool 2020 (software tool 2002 can instruct the lithographic tool 2020) is configured to pattern the design features 108 of the corrected layout 2006 at locations on a wafer 102.

At block 2506, the lithographic tool 2020 (software tool 2002 can instruct the lithographic tool 2020) is configured to deposit a first film 250 (as depicted in FIG. 26A) and a second film 250 (as depicted in FIG. 26C) using shadow mask evaporation according to the corrected layout 2006.

Examples of superconducting materials (at low temperatures, such as about 10-100 millikelvin (mK), or about 4 K) include niobium, aluminum, tantalum, etc. For example, the Josephson junctions are made of superconducting material, and their tunnel junctions can be made of a thin tunnel barrier, such as an oxide. Any transmission lines (i.e., wires) connecting the various elements are made of a superconducting material.

Various embodiments of the present invention are described herein with reference to the related drawings. Alternative embodiments can be devised without departing from the scope of this invention. References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor or superconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist (and/or alternatively by e-beam resist in e-beam lithography). To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

What is claimed is:

1. A method for correcting an area of overlap between two films created by sequential shadow mask evaporations, the method comprising:

correcting design features in an original layout to generate a corrected layout, wherein the design features in the corrected layout have been modified in advance to account for being at different positions relative to an evaporation source;

patterning the design features of the corrected layout at locations on a wafer; and depositing a first film and a second film using shadow mask evaporation according to the corrected layout.

2. The method of claim 1, wherein the design features in the corrected layout have been modified in advance to account for being at the different positions relative to the evaporation source comprises forming at least one design feature of the design features with a larger opening than another one design feature of the design features.

3. The method of claim 1, wherein the patterning the design features of the corrected layout at the locations on the wafer comprises patterning at least one design feature of the design features with a larger opening than another one design feature of the design features.

4. The method of claim 1, wherein the patterning the design features of the corrected layout at the locations on the wafer comprises using a greater exposure dose to pattern at least one design feature of the design features to have a larger opening than an exposure dose to pattern another one design feature of the design features.

5. The method of claim 1, wherein the patterning the design features of the corrected layout at the locations on the wafer comprises using a greater exposure time to pattern at least one design feature of the design features to have a larger opening than an exposure time to pattern another one design feature of the design features.

6. The method of claim 1, wherein the overlap between the first film and the second film defines a tunnel junction.

7. The method of claim 1, wherein the corrected layout includes a positional tilt correction.

8. The method of claim 7, wherein the positional tilt correction is configured to modify shapes of the design features relative to a position of the evaporation source and individual design features of the design features.

9. The method of claim 1, wherein the corrected layout includes a sidewall deposit correction.

10. The method of claim 9, wherein the sidewall deposit correction is configured to modify shapes of the design features relative to a previous sidewall deposit from a previous shadow mask evaporation.

11. The method of claim 1, wherein the corrected layout includes a sidewall flashing correction.

12. The method of claim 11, wherein the sidewall flashing correction is configured to modify shapes of the design features to prevent a width of the first film or the second film, or both the first film and the second film from being reduced by flashing against a sidewall of a resist material.

13. The method of claim 1, wherein corrections in the corrected layout include at least two types of corrections selected from a group consisting of: a positional tilt correction, a sidewall deposit correction, and a sidewall flashing correction.

14. The method of claim 13, wherein the overlap between the first film and the second film defines a tunnel junction.

15. A method for correcting an area of overlap between two films created by sequential shadow mask evaporations, the method comprising:

correcting design features in an original layout to generate a corrected layout, wherein the design features in the corrected layout have been modified in advance to account for sidewall deposits of material on the design features from an evaporation source;

patterning the design features of the corrected layout at locations on a wafer; and depositing a first film and a second film using shadow mask evaporation according to the corrected layout.

16. The method of claim 15, wherein the sidewall deposits are formed on sidewalls of the design features.

17. The method of claim 15, wherein the design features in the corrected layout have been modified in advance to account for the sidewall deposits of material on the design features from the evaporation source comprises increasing a width of the design features respectively by a corresponding width of the sidewall deposits.

18. A method for correcting an area of overlap between two films created by sequential shadow mask evaporations, the method comprising:

correcting design features in an original layout to generate a corrected layout, wherein the design features in the corrected layout have been modified in advance to account for flashing against a sidewall of a resist during a shadow mask evaporation;

patterning the design features of the corrected layout at locations on a wafer; and depositing a first film and a second film using the shadow mask evaporation according to the corrected layout.

19. The method of claim 18, wherein the design features in the corrected layout have been modified in advance to account for the flashing against the sidewall of the resist during the shadow mask evaporation comprises increasing an undercut of the resist.

20. The method of claim 18, wherein the design features in the corrected layout have been modified in advance to account for the flashing against the sidewall of the resist during the shadow mask evaporation comprises increasing a width of at least one design feature of the design features to compensate for the flashing.

* * * * *